United States Patent
Ren et al.

(10) Patent No.: US 11,676,793 B2
(45) Date of Patent: Jun. 13, 2023

(54) APPARATUS OF PLURAL CHARGED PARTICLE BEAMS

(71) Applicant: ASML Netherlands B.V., Veldhoven (NL)

(72) Inventors: Weiming Ren, San Jose, CA (US); Xuedong Liu, San Jose, CA (US); Xuerang Hu, San Jose, CA (US); Zhong-wei Chen, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 25 days.

(21) Appl. No.: 16/679,023

(22) Filed: Nov. 8, 2019

(65) Prior Publication Data
US 2020/0161079 A1 May 21, 2020

Related U.S. Application Data

(60) Provisional application No. 62/768,799, filed on Nov. 16, 2018.

(51) Int. Cl.
*H01J 37/145* (2006.01)
*H01J 37/26* (2006.01)
*H01J 37/285* (2006.01)

(52) U.S. Cl.
CPC ............ *H01J 37/145* (2013.01); *H01J 37/26* (2013.01); *H01J 37/285* (2013.01)

(58) Field of Classification Search
CPC .. H01J 37/10; H01J 37/12; H01J 37/14; H01J 37/141; H01J 37/143; H01J 37/26; H01J 37/285; H01J 37/145
See application file for complete search history.

(56) References Cited

U.S. PATENT DOCUMENTS

| 4,806,766 A | * | 2/1989 | Chisholm | H01J 37/14 |
| | | | | 250/311 |
| 4,831,266 A | * | 5/1989 | Frosien | H01J 37/10 |
| | | | | 250/396 ML |

(Continued)

FOREIGN PATENT DOCUMENTS

| JP | S 6476654 A | 3/1989 |
| JP | H 01296549 A | 11/1989 |

(Continued)

OTHER PUBLICATIONS

International Search Report issued in related International Application No. PCT/EP2019/079076, dated Jan. 23, 2020 (4 pgs.).

(Continued)

*Primary Examiner* — Sean M Luck
(74) *Attorney, Agent, or Firm* — Finnegan, Henderson, Farabow, Garrett & Dunner, LLP

(57) ABSTRACT

An electromagnetic compound lens may be configured to focus a charged particle beam. The compound lens may include an electrostatic lens provided on a secondary optical axis and a magnetic lens also provided on the secondary optical axis. The magnetic lens may include a permanent magnet. A charged particle optical system may include a beam separator configured to separate a plurality of beamlets of a primary charged particle beam generated by a source along a primary optical axis from secondary beams of secondary charged particles. The system may include a secondary imaging system configured to focus the secondary beams onto a detector along the secondary optical axis. The secondary imaging system may include the compound lens.

19 Claims, 11 Drawing Sheets

(56) References Cited

U.S. PATENT DOCUMENTS

| | | | |
|---|---|---|---|
| 7,064,325 B2 | 6/2006 | Buijsse et al. | |
| 7,067,820 B2 | 6/2006 | Buijsse | |
| 8,294,095 B2* | 10/2012 | Chen | H01J 37/141 |
| | | | 250/310 |
| 8,389,935 B2* | 3/2013 | Fukuda | H01J 37/28 |
| | | | 250/306 |
| 8,618,480 B2* | 12/2013 | Ren | H01J 37/28 |
| | | | 250/311 |
| 8,698,093 B1* | 4/2014 | Gubbens | H01J 37/28 |
| | | | 250/396 ML |
| 9,349,571 B2* | 5/2016 | Kemen | H01J 37/10 |
| 9,418,815 B2* | 8/2016 | Yasuda | H01J 3/20 |
| 2005/0236568 A1* | 10/2005 | Buijsse | H01J 37/143 |
| | | | 250/310 |
| 2008/0067396 A1 | 3/2008 | Ohshima et al. | |
| 2008/0121810 A1* | 5/2008 | Liu | H01J 37/145 |
| | | | 250/396 ML |
| 2011/0148297 A1* | 6/2011 | Yasuda | H01J 37/143 |
| | | | 315/5.35 |
| 2012/0049064 A1* | 3/2012 | Ren | H01J 37/145 |
| | | | 250/310 |
| 2012/0119087 A1* | 5/2012 | Takahashi | H01J 37/10 |
| | | | 250/310 |
| 2012/0199740 A1* | 8/2012 | Zeidler | H01J 37/28 |
| | | | 250/310 |
| 2014/0291510 A1* | 10/2014 | Chen | H01J 37/292 |
| | | | 250/307 |
| 2015/0021476 A1* | 1/2015 | Shanel | H01J 37/26 |
| | | | 250/310 |
| 2016/0163502 A1* | 6/2016 | Li | H01J 37/28 |
| | | | 250/307 |
| 2016/0172150 A1* | 6/2016 | Li | H01J 37/145 |
| | | | 250/310 |
| 2016/0189916 A1* | 6/2016 | Frosien | H01J 37/153 |
| | | | 250/396 R |
| 2016/0268096 A1* | 9/2016 | Ren | H01J 37/1472 |
| 2017/0040139 A1* | 2/2017 | Nomaguchi | H01J 37/09 |
| 2017/0154756 A1 | 6/2017 | Ren et al. | |
| 2018/0323036 A1 | 11/2018 | Mohammadi-Gheidari et al. | |

FOREIGN PATENT DOCUMENTS

| | | |
|---|---|---|
| JP | 2004327439 A | 11/2004 |
| JP | 2005310778 A | 11/2005 |
| JP | 2007311117 A | 11/2007 |
| KR | 2018-0018483 | 2/2018 |
| TW | 201129795 A1 | 9/2011 |
| WO | WO 2004/100206 A1 | 11/2004 |
| WO | WO 2018/122176 A1 | 7/2011 |

OTHER PUBLICATIONS

Office Action issued by the Intellectual Property Office (IPO) in related (ROC) Taiwanese Patent Application No. 108141114, dated Sep. 2, 2020 (16 pgs.).

Notice of Reasons for Rejection issued by the Japan Patent Office in related Japanese Patent Application No. 2021-523345; dated May 25, 2022 (8 pgs.).

Notification of Reason(s) for Refusal issued in related Korean Patent Application No. 10-2021-7014883; dated Jan. 14, 2023 (12 pgs.).

* cited by examiner

APPARATUS OF PLURAL CHARGED PARTICLE BEAMS

CROSS-REFERENCE TO RELATED APPLICATIONS

This application claims priority of U.S. application 62/768,799 which was filed on Nov. 16, 2018, and which is incorporated herein in its entirety by reference.

TECHNICAL FIELD

The embodiments provided herein relate to charged particle optical systems that may be applicable in a charged particle apparatus with one or more charged particle beams, such as an electron microscopy apparatus utilizing one or more electron beams.

BACKGROUND

In manufacturing processes for integrated circuits (ICs), circuit components may be inspected to ensure they are manufactured according to design and are free of defects. Pattern defects, uninvited particles (residuals), or the like may appear on a wafer or a mask during fabrication, and may thereby reduce yield. For example, uninvited particles may be troublesome for patterns with smaller critical feature dimensions, which have been adopted to meet the more and more advanced performance requirements of IC chips.

A charged particle (e.g., electron) beam microscope, such as a scanning electron microscope (SEM) or a transmission electron microscope (TEM), capable of resolution down to less than a nanometer, serves as a practicable tool for inspecting IC components having a feature size that is sub-100 nanometers. In a SEM tool, a beam of primary electrons having a relatively high energy is decelerated to land on a sample at a relatively low landing energy and is focused to form a probe spot thereon. Due to this focused probe spot of primary electrons, secondary electrons will be generated from the surface. By scanning the probe spot over the sample surface and collecting the secondary electrons, pattern inspection tools may obtain an image of the sample surface.

Optical elements, such as lenses, deflectors, and the like, within single or multi-beam inspection tools may introduce dispersion or aberration in beams that are used for inspection. For example, a beam of primary electrons may be generated along an optical axis while a detector for collecting secondary electrons is placed off-axis. In an inspection system comprising multiple primary beams or multiple secondary beams, a beam separator may be used to separate beams of secondary electrons from the primary beams and direct the secondary beams toward the off-axis detector. Because a beam separator may comprise a magnetic deflector that is used to deflect electrons using electromagnetism, the beam separator may generate dispersion in beams passing therethrough. Furthermore, lenses may generate an aberration that is affected by their size, structure, operating conditions, and placement within an optical system. Dispersion and aberration may reduce resolution for reconstructing images of the inspected sample surface, among other effects.

SUMMARY

Embodiments of the present disclosure may provide an electromagnetic compound lens. The compound lens may include an electrostatic lens and a magnetic lens. The magnetic lens may include a permanent magnet. A focusing power of the compound lens may be changed by varying a focusing power of the electrostatic lens. Embodiments of the present disclosure may provide a charged particle optical system. The system may include a beam separator configured to separate a plurality of beamlets of a primary charged particle beam generated by a source and travelling along a primary optical axis from a plurality of secondary charged particle beams generated from a sample by the plurality of beamlets. The secondary charged particle beams may travel along a secondary optical axis after passing through the beam separator. The system may include a secondary imaging system configured to focus the secondary charged particle beams onto a plurality of detection elements of a detector along the secondary optical axis. The secondary imaging system may include a zoom lens. The zoom lens may be close to the beam separator and includes an electromagnetic compound lens. The compound lens may be the first lens in the zoom lens from an entrance side of the secondary imaging system counting from the beam separator.

Exemplary advantages and effects of the present invention will become apparent from the following description taken in conjunction with the accompanying drawings wherein certain embodiments of the present invention are set forth by way of illustration and example.

DETAILED DESCRIPTION

Figure 1A:
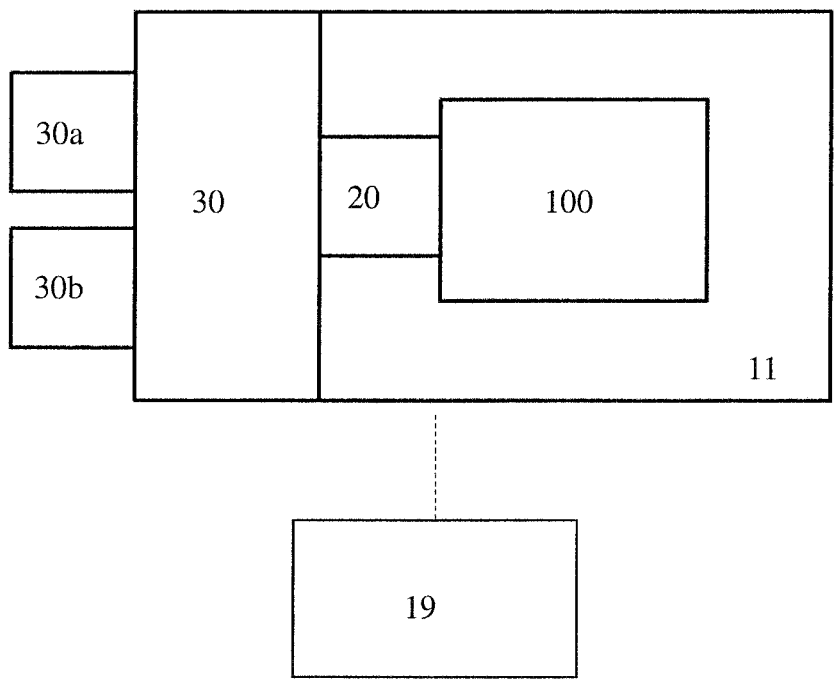
FIG. 1A is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of systems, apparatuses, and methods consistent with aspects related to the invention as recited in the appended claims. Relative dimensions of elements in drawings may be exaggerated for clarity.

The enhanced computing power of electronic devices, while reducing the physical size of the devices, can be accomplished by significantly increasing the packing density of circuit components such as, transistors, capacitors, diodes, etc. on an IC chip. For example, in a smart phone, an IC chip (which may be the size of a thumbnail) may include over 2 billion transistors, the size of each transistor being less than 1/1000th of a human hair. Not surprisingly, semiconductor IC manufacturing is a complex process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get 75% yield, each individual step must have a yield greater than 99.4%, and if the individual step yield is 95%, the overall process yield drops to 7%.

It is increasingly important to ensure the ability to detect defects with high accuracy and high resolution while maintaining high throughput (defined as the number of wafers processed per hour, for example). High process yields and high wafer throughput may be impacted by the presence of defects, especially when operator intervention is involved. Thus, detection and identification of micro and nano-sized defects by inspection tools (such as a SEM) is important for maintaining high yields and low cost.

Inspection tools using charged particle beams may achieve high resolution and high throughput. In some inspection tools that are used for inspecting a sample, a primary beam may be generated from a charged particle source. As shown, for example in FIG. 1B, a primary beam 102 generated from source 101 travels along a primary optical axis 100_1 and one or more beamlets (such as 102_1, 102_2 and 102_3) of primary beam 102 strike a sample 1. Then, one or more secondary beams of secondary charged particles may be generated from the sample by the one or more beamlets, which may travel in the reverse direction along the primary optical axis. Eventually, the one or more secondary beams of secondary charged particles may reach a detector, such as electron detection device 140M, where an imaging signal of the sample is generated.

To impede the detection of the secondary beams from interfering with the one or more beamlets, the detector may be placed at some location away from the primary optical axis, such as along optical axis 150_1. Accordingly, a beam separator, such as element 160, may be provided on the primary optical axis to divert the one or more secondary beams toward the detector. Thus, the one or more beamlets may pass through the beam separator without being diverted before reaching the sample, and the one or more secondary beams may be diverted as they pass through the beam separator before reaching the detector.

Figure 4A:
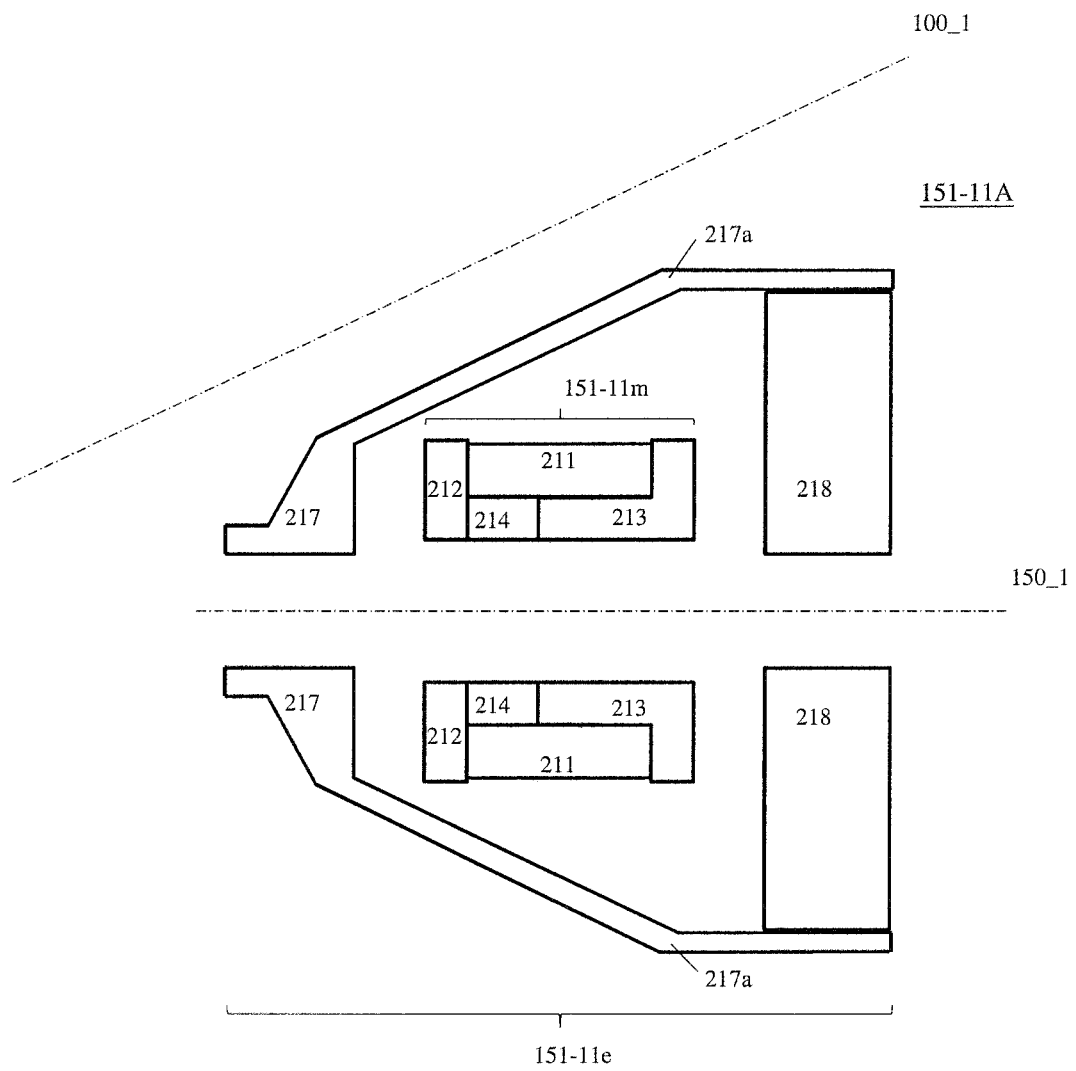
FIG. 4A illustrates an exemplary configuration of a lens that may be used in a secondary imaging system of an EBI system, consistent with embodiments of the present disclosure.

While a beam separator can selectively change the direction of a beam, an effect of using the beam separator may be that beams passing through may experience dispersion. Dispersion may have negative effects on beam size and associated imaging quality. Because the beam separator may introduce a dispersion influence, both on the beamlets of the primary beam and on the secondary beams, which increases with the separation angle between the primary and secondary beams, operating parameters of the beam separator may be set so that the separation angle is small. As an example, in FIG. 1B, beam separator 160 may be operated to deflect secondary beams, such as secondary electron beam 102_1$se$, with a small angle $\alpha$ toward electron detection device 140M and not deflect the beamlets (102_1, 102_2, 102_3). The angle $\alpha$ is the separation angle. However, doing so may limit the space available for placing electron optical elements in the inspection tool, such as a secondary imaging system used for projecting the secondary beams to the detector. According to aspects of this application, some elements of an inspection tool, such as lens 151-11A as shown in FIG. 4A, may be provided in a confined space between primary optical axis 100_1 and secondary optical axis 150_1.

Secondary beams pass through various lenses on their way to the detector. For example, as shown in FIG. 1B, secondary beams pass through a secondary imaging system 150 that may contain one or more lenses. The lenses may introduce aberration influence on secondary beams passing through. Some ways to reduce aberrations of the lenses may be to make lenses larger, use a "positive mode" in the case of an electrostatic lens, or use magnetic lenses. However, increasing the sizes of lenses or using magnetic lenses requires more space to be available for placing the lenses in the inspection tool. Furthermore, the positive mode requires higher electrical voltages which may increase risks of electrical arcing, especially in tight spaces where electrodes with high voltage differences may be close to one another.

Thus, there are competing objectives for minimizing dispersion influence and minimizing aberration in inspection tools. Because both dispersion and aberration may degrade imaging quality, it is desirable to reduce both dispersion and aberration simultaneously. Furthermore, because harmful effects such as dispersion and aberration may propagate throughout an optical system, it is desirable to reduce such effects as early as possible in optical systems of inspection tools.

Further, some lenses in optical systems may use electromagnets. An electromagnet is a type of magnet that includes coils and a magnetic yoke covering the coils. A magnetic field is generated by running electric current through the coils and the magnetic yoke enhances the magnetic field and directs the magnetic field to leak out through a non-magnetic gap between two pole-pieces of the magnetic yoke. Generally, a magnetic field may generate less aberration than a comparable electrostatic field when used for focusing a beam. Thus, a lens that generates a magnetic field, or a combination of a magnetic field and an electrostatic field, may be beneficial when applied in an inspection tool. If a lens is required to be adjustable to handle a variety of focusing conditions, one or both of the magnetic field and the electrostatic field need to be changeable. If an electromagnet is used to generate the magnetic field, it requires a power source to continuously provide current to the coils of the electromagnet to maintain the magnetic field, and may, resultantly, be bulky and complex.

Furthermore, the coils of electromagnets generate heat, which may have negative effects on the stability of the magnetic lens and the associated imaging quality. Some aspects of the application may use a permanent magnet that may avoid some of the issues with electromagnets. For example, in comparison to an electromagnet, a permanent magnet may take up a smaller space, may generate less heat, and does not require a connection to a driver. Accordingly, a permanent magnet may be suitable for placing in a high voltage environment.

In some embodiments of the disclosure, effects of dispersion and aberration in an inspect tool may be reduced or eliminated. For example, a beam separator may be configured to deflect secondary beams a small amount, while an electromagnetic compound lens is provided where the available space is limited. The compound lens may include a magnetic portion and an electrostatic portion. The magnetic portion may include a permanent magnet. The compound lens may allow its focusing power to be provided partially by the magnetic portion and partially by the electrostatic portion, and an adjustable part of the focusing power may be provided by the electrostatic portion. The magnetic portion may be beneficial for reducing aberration, while adjustability may be achieved through the electrostatic portion. The electrostatic portion may be operated in positive mode, which may also be beneficial for reducing aberration. Thus, imaging resolution of the inspection tool may be improved.

Without limiting the scope of the present disclosure, descriptions and drawings of embodiments may be exemplarily referred to as using an electron beam. However, the embodiments are not used to limit the present invention to specific charged particles. For example, systems and methods for beam forming may be applied to photons, x-rays, and ions, etc. Furthermore, the term "beam" may refer to primary electron beams, primary electron beamlets, or secondary electron beams, among others.

As used herein, unless specifically stated otherwise, the term "or" encompasses all possible combinations, except where infeasible. For example, if it is stated that a component includes A or B, then, unless specifically stated otherwise or infeasible, the component may include A, or B, or A and B. As a second example, if it is stated that a component includes A, B, or C, then, unless specifically stated otherwise or infeasible, the component may include A, or B, or C, or A and B, or A and C, or B and C, or A and B and C.

Figure 1B:
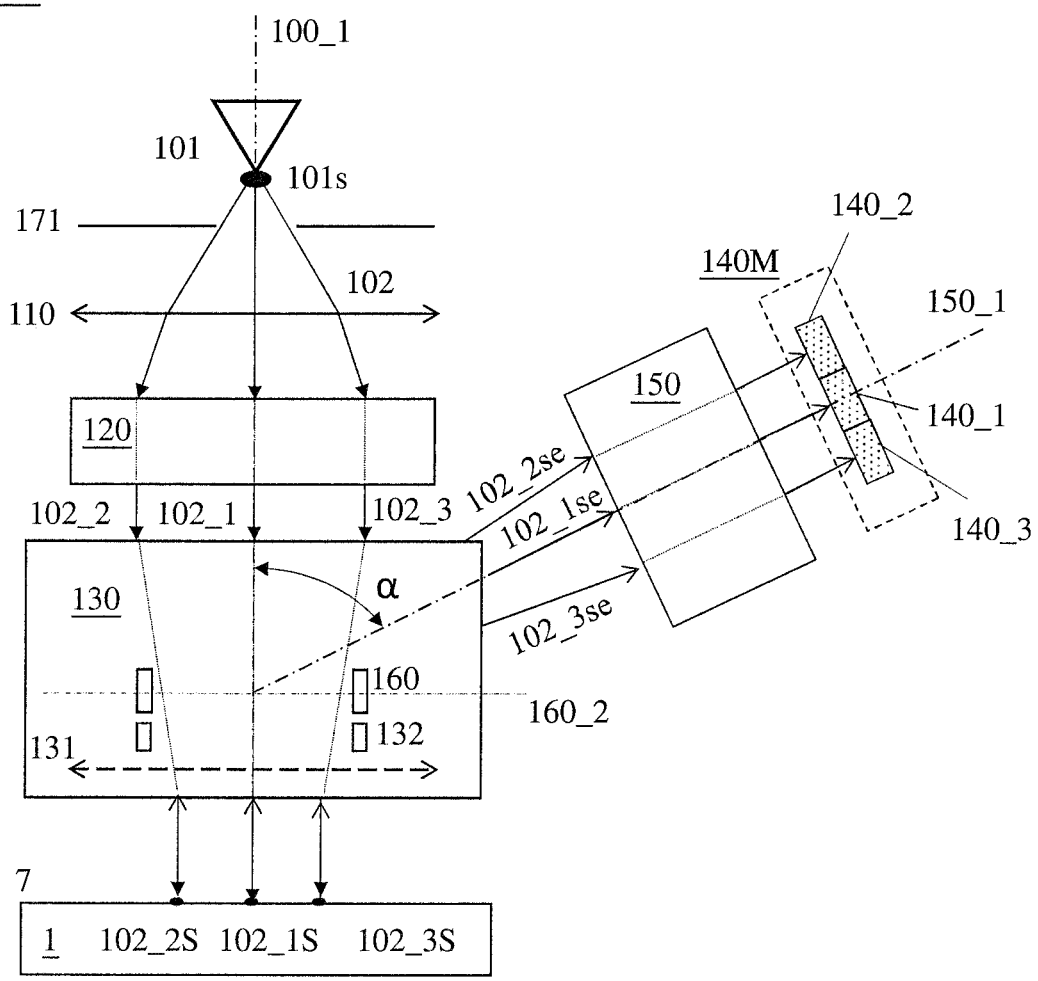
FIG. 1B illustrates an exemplary electron beam tool that may be part of the electron beam inspection system of FIG. 1A.

Reference is now made to FIG. 1A, which illustrates an exemplary electron beam inspection (EBI) system 10, consistent with embodiments of the present disclosure. As shown in FIG. 1A, EBI system 10 includes a main chamber 11, a load/lock chamber 20, an electron beam tool 100, and an equipment front end module (EFEM) 30. Electron beam tool 100 is located within main chamber 11.

EFEM 30 includes a first loading port 30a and a second loading port 30b. EFEM 30 may include additional loading port(s). First loading port 30a and second loading port 30b may, for example, receive wafer front opening unified pods (FOUPs) that contain wafers (e.g., semiconductor wafers or wafers made of other material(s)) or samples to be inspected (wafers and samples may be collectively referred to as "wafers" hereafter). One or more robotic arms (not shown) in EFEM 30 may transport the wafers to load/lock chamber 20.

Load/lock chamber 20 is connected to a load/lock vacuum pump system (not shown) that removes gas molecules in load/lock chamber 20 to reach a first pressure below the atmospheric pressure. After reaching the first pressure, one or more robotic arms (not shown) may transport the wafer from load/lock chamber 20 to main chamber 11. Main chamber 11 is connected to a main chamber vacuum pump system (not shown), which removes gas molecules in main chamber 11 to reach a second pressure below the first pressure. After reaching the second pressure, the wafer is subject to inspection by electron beam tool 100. Electron beam tool 100 may be a single-beam system or a multi-beam system. A controller 19 is electronically connected to electron beam tool 100. While controller 19 is shown in FIG. 1A as being outside of the structure that includes main chamber 1, load/lock chamber 20, and EFEM 30, it is appreciated that controller 19 may be part of the structure.

While the present disclosure provides examples of main chamber 11 housing an electron beam inspection system, it should be noted that aspects of the disclosure in their broadest sense, are not limited to a chamber housing an electron beam inspection system. Rather, it is appreciated that the principles discussed herein may also be applied to other tools that operate under the second pressure.

FIG. 1B illustrates an exemplary electron beam tool 100A that may be part of the EBI system of FIG. 1A. An electron beam tool 100A (also referred to herein as "apparatus 100A") comprises an electron source 101, a gun aperture plate 171, a condenser lens 110, a source conversion unit 120, a primary projection system 130, a secondary imaging system 150, and an electron detection device 140M. Primary projection system 130 may comprise an objective lens 131. A sample 1 with a surface 7 may be provided on a movable stage (not shown). Electron detection device 140M may comprise a plurality of detection elements 140_1, 140_2, and 140_3. A beam separator 160 and a deflection scanning unit 132 may be placed inside primary projection system 130.

Electron source 101, gun aperture plate 171, condenser lens 110, source conversion unit 120, beam separator 160, deflection scanning unit 132, and primary projection system 130 may be aligned with a primary optical axis 100_1 of apparatus 100A. Secondary imaging system 150 and electron detection device 140M may be aligned with a secondary optical axis 150_1 of apparatus 100A.

Electron source 101 may comprise a cathode (not shown) and an extractor or anode (not shown), in which, during operation, electron source 101 is configured to emit primary electrons from the cathode and the primary electrons are extracted or accelerated by the extractor or the anode to form a primary electron beam 102 that forms a primary beam crossover (virtual or real) 101s. Primary electron beam 102 may be visualized as being emitted from primary beam crossover 101s.

Source conversion unit 120 may comprise an image-forming element array (not shown in FIG. 1B) and a beam-limit aperture array (not shown in FIG. 1B). The image-forming element array may comprise a plurality of micro-deflectors or micro-lenses that may influence a plurality of primary beamlets 102_1, 102_2, 102_3 of primary electron beam 102 and form a plurality of parallel images (virtual or real) of primary beam crossover 101s, one for each of the primary beamlets 102_1, 201_2, 102_3. The beam-limit aperture array may be configured to limit diameters of individual primary beamlets 102_1, 102_2, and 102_3. FIG. 1B shows three primary beamlets 102_1, 102_2, and 102_3 as an example, and it is appreciated that source conversion unit 120 may be configured to form any number of primary beamlets. For example, source conversion unit 120 may be configured to form a 3×3 array of primary beamlets. Source conversion unit 120 may further comprise an aberration compensator array configured to compensate aberrations of probe spots, 102_1S, 102_2S, and 102_3S. In some embodiments, the aberration compensator array may include a field curvature compensator array with micro-lenses that are configured to compensate field curvature aberrations of probe spots, 102_1S, 102_2S, and 102_3S, respectively. In some embodiments, the aberration compensator array may include an astigmatism compensator array with micro-stigmators that are configured to compensate astigmatism aberrations of probe spots, 102_1S, 102_2S, and 102_3S, respectively. In some embodiments, the image-forming element array, the field curvature compensator array, and the astigmatism compensator array may comprise multiple layers of micro-deflectors, micro-lenses, and micro-stigmators, respectively. Examples of a multi-layer array are further described in U.S. Patent Application No. 62/567,134, which is incorporated herein in its entirety.

Condenser lens 110 is configured to focus primary electron beam 102. Condenser lens 110 may further be configured to adjust electric currents of primary beamlets 102_1, 102_2, and 102_3 downstream of source conversion unit 120 by varying the focusing power of condenser lens 110. Beamlets 102_1, 102_2, and 102_3 may thereby have a focusing status that may be changed by condenser lens 110. Alternatively, the electric currents may be changed by altering the radial sizes of beam-limit apertures within the beam-limit aperture array corresponding to the individual primary beamlets. Thus, current of a beamlet may be different at different locations along the beamlet's path. Beamlet current may be adjusted so that current of the beamlet on the sample surface (e.g., probe spot current) is set to a desired amount.

Condenser lens 110 may be a movable condenser lens that may be configured so that the position of its first principle plane is movable. The movable condenser lens may be configured to be magnetic, or electrostatic, or electromagnetic (e.g., compound). A movable condenser lens is further described in U.S. Pat. No. 9,922,799 and U.S. Patent Application Pub. No. 2017/0025243, both of which are incorporated herein in their entirety. In some embodiments, the condenser lens may be an anti-rotation lens, which may keep rotation angles of off-axis beamlets unchanged while varying the electric currents of the beamlets. In some embodiments, condenser lens 110 may be a movable anti-rotation condenser lens, which involves an anti-rotation lens with a movable first principal plane. An anti-rotation or movable anti-rotation condenser lens is further described in International Publication No. WO 2018/122176, which is incorporated by reference in its entirety.

Objective lens 131 may be configured to focus beamlets 102_1, 102_2, and 102_3 onto sample 1 for inspection and may form three probe spots 102_1S, 102_2S, and 102_3S on surface 7, as shown in the depicted embodiment. Gun aperture plate 171, in operation, is configured to block off peripheral electrons of primary electron beam 102 to reduce Coulomb effect. The Coulomb effect may enlarge the size of each of probe spots 102_1S, 102_2S, and 102_3S of primary beamlets 102_1, 102_2, 102_3, and therefore may deteriorate inspection resolution.

Beam separator 160 may, for example, be a Wien filter comprising an electrostatic deflector generating an electrostatic dipole field E1 and a magnetic dipole field B1. Beam separator 160 may employ Lorentz force to influence electrons passing therethrough. Beam separator 160 may be activated to generate electrostatic dipole field E1 and magnetic dipole field B1. In operation, beam separator 160 may be configured to exert an electrostatic force by electrostatic dipole field E1 on individual electrons of primary beamlets 102_1, 102_2, and 102_3. The electrostatic force may be equal in magnitude but opposite in direction to the magnetic force exerted by magnetic dipole field B1 of beam separator 160 on the individual electrons. Primary beamlets 102_1, 102_2, and 102_3 may pass substantially straight through beam separator 160.

Deflection scanning unit 132, in operation, is configured to deflect primary beamlets 102_1, 102_2, and 102_3 to scan probe spots 102_1S, 102_2S, and 102_3S across individual scanning areas in a section of surface 7. In response to illumination of sample 1 by primary beamlets 102_1, 102_2, and 102_3 at probe spots 102_1S, 102_2S, and 102_3S, secondary electrons emerge from sample 1 and form three secondary electron beams 102_1se, 102_2se, and 102_3se, which, in operation, are emitted from sample 1. Each of secondary electron beams 102_1se, 102_2se, and 102_3se typically comprise electrons having different energies including secondary electrons (e.g., having electron energy ≤50 eV) and backscattered electrons (e.g., having electron energy between 50 eV and the landing energy of primary beamlets 102_1, 102_2, and 102_3).

Beam separator 160 is configured to deflect secondary electron beams 102_1se, 102_2se, and 102_3se toward secondary imaging system 150. Secondary imaging system 150 subsequently focuses secondary electron beams 102_1se, 102_2se, and 102_3se onto detection elements 140_1, 140_2, and 140_3 of electron detection device 140M. Detection elements 140_1, 140_2, and 140_3 are arranged to detect corresponding secondary electron beams 102_1se, 102_2se, and 102_3se and generate corresponding signals that may be sent to signal processing units (not shown) to, for example, construct images of the corresponding scanned areas of sample 1.

Beam separator 160 may be configured to deflect secondary electron beams by an angle α toward secondary imaging system 150. Angle α may be determined as the angle between primary optical axis 100_1 and secondary optical axis 150_1. Angle α may represent the separation angle between an on-axis primary electron beamlet and its corresponding secondary electron beamlet. In some embodiments, angle α may be set within a range of 5 to 25 degrees.

As discussed above, beam separator 160 may be a deflection device that includes a magnetic deflector, such as a Wien filter. The deflection device may deflect electrons passing therethrough. The deflection directions and deflection angles of the electrons may depend on the movement directions and energies (which may be represented by, e.g., velocities) of the electrons. Primary electrons may travel toward sample 1 while secondary electrons are generated from surface 7 of sample 1 and travel away from sample 1. Thus, primary electrons moving in a direction different from secondary or backscattered electrons may be distinguished from secondary or backscattered electrons. Accordingly, primary beamlets 102_1, 102_2, and 102_3 may be allowed to pass substantially straight through beam separator 160 while secondary electron beams 102_1se, 102_2se and 102_3se are deflected away from optical axis 100_1, such as by angle α.

However, primary beamlets 102_1, 102_2, and 102_3 themselves may comprise electrons at differing energy levels. Therefore, dispersion may be generated in each of primary beamlets 102_1, 102_2, and 102_3. Dispersion may influence primary beamlets 102_1, 102_2, and 102_3 to form probe spots on sample 1 that deviate from a desired shape, or that become broadened. Consequently, dispersion may cause probe spots to be formed, for example, with an oblong shape, or that are enlarged. Dispersion caused by beam separator 160 may deteriorate imaging resolution.

Furthermore, dispersion may influence secondary electron beams 102_1se, 102_2se, and 102_3se to form larger spots on electron detection device 140M. Dispersion may deteriorate secondary electron collection efficiency and contribute to cross-talk.

In FIG. 1B, the paths of beamlets within primary projection system 130 may merely be schematic. For example, representation of beamlets travelling linearly through beam deflector 160, deflection scanning unit 132, and objective lens 131 in dotted lines, as shown in FIG. 1B, may indicate a corresponding relationship between beamlets entering and exiting electron optical elements or systems, such as primary projection system 130. That is, the trajectory of beamlets may be different from that shown within primary projection system 130 in FIG. 1B. Relative positions of beamlets may change with configuration and operation modes of electron optical elements.

Separation angle α may be set based on various criteria. In some embodiments, separation angle α may be set so as to minimize dispersion influence. For example, separation angle α may be chosen to be as small as possible. Beam separator 160 may be configured to deflect secondary beamlets as little as possible so that magnitudes of electrostatic dipole field E1 and magnetic dipole field B1 generated by beam separator 160 are minimized. To minimize dispersion influence, it may be effective to reduce the magnitudes of E1 and B1.

However, reducing separation angle α may limit the space available between primary optical axis 100_1 and secondary optical axis 150_1. The limitation of space imposes packaging constraints on secondary imaging system 150. Such constraints may limit flexibility for sizes and positions of elements in secondary imaging system 150, such as lenses.

Figure 1C:
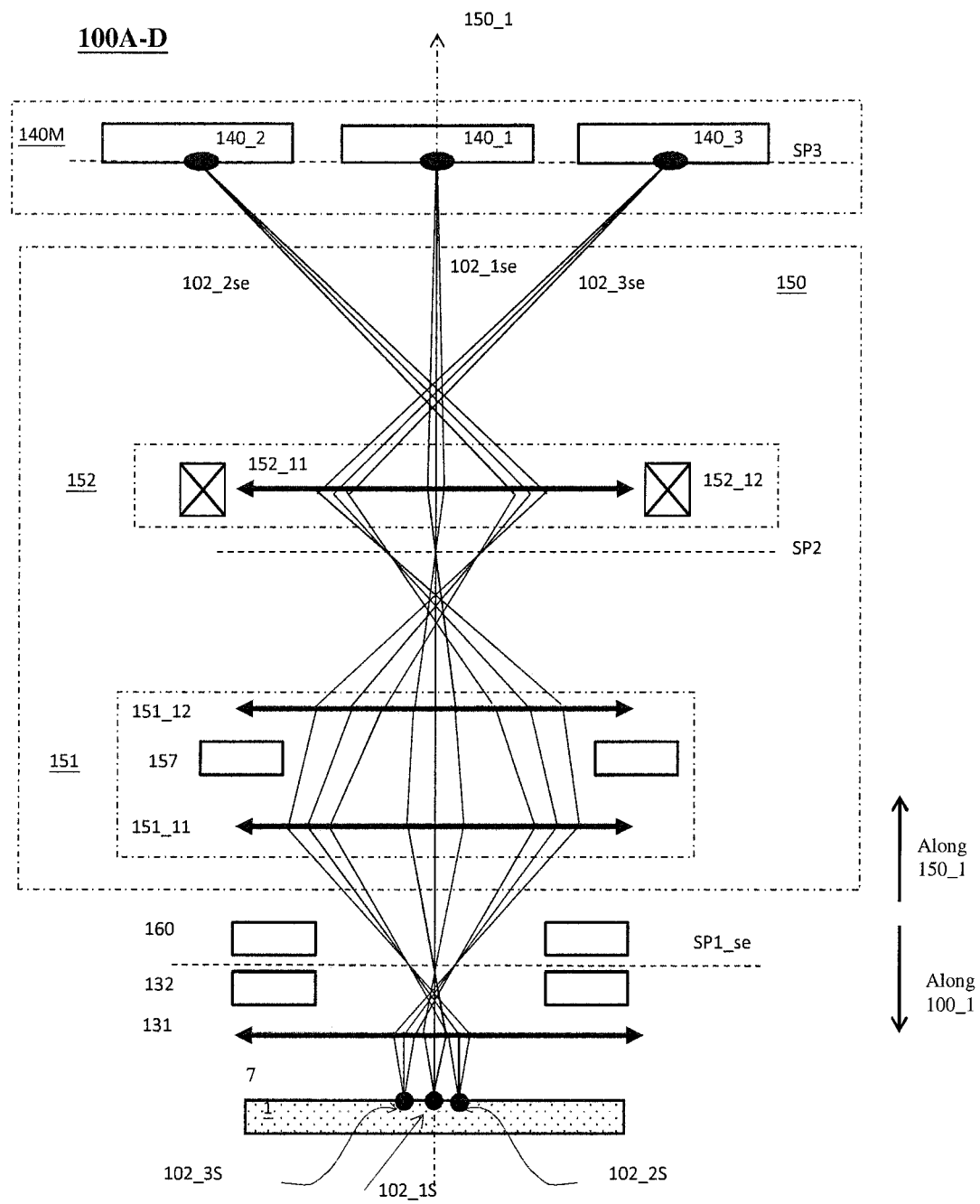
FIG. 1C illustrates an exemplary secondary imaging system, consistent with embodiments of the present disclosure.

FIG. 1C illustrates an exemplary configuration of a detection system 100A-D that may form part of apparatus 100A. Detection system 100A-D may include secondary imaging system 150 and electron detection device 140M. Secondary imaging system 150 may include zoom lens 151, projection lens 152, and anti-scanning deflection unit 157 that may all be aligned with secondary optical axis 150_1. Detection elements 140_1, 140_2, and 140_3 of electron detection device 140 may be placed on detection plane SP3. Zoom lens 151, projection lens 152, and objective lens 131 may together project an image of sample surface 7 onto detection plane SP3. These elements may focus secondary electron beams 102_1se, 102_2se, and 102_3se to form secondary electron spots on detection elements 140_1, 140_2, and 140_3 respectively when deflection scanning unit 132 is off. Anti-scanning deflection unit 157 may be configured to keep secondary electron spots within corresponding detection elements when deflection scanning unit 132 scans beamlets 102_1, 102_2, and 102_3 over respective regions.

The total imaging magnification from surface 7 of sample 1 to detection plane SP3 may be determined in terms of a pitch of probe spots on detection elements (e.g., pitch between secondary electron spots on detection elements 140_1, 140_2, and 140_3) and a pitch of probe spots on sample 1 (e.g., pitch between probe spots, 102_1S, 102_2S, and 102_3S). Magnification may be defined as the ratio of the pitches.

Each probe spot on sample surface 7 may be imaged onto one detection element, thereby ensuring a corresponding relationship between the plurality of probe spots and the plurality of detection elements. In some embodiments, probe spot pitch on sample 1 may be different for different inspection applications, and magnification may be changed accordingly.

Zoom lens 151 may include two lenses 151_11 and 151_12. Lenses 151_11 and 151_12 may be electrostatic lenses. The image plane of zoom lens 151 may be configured to be at transfer plane SP2. A field lens may be provided at transfer plane SP2. In some embodiments, position of transfer plane SP2 may be different in different modes, such as slow secondary electron detection mode and backscattered electron detection mode.

Projection lens 152 may include an electrostatic lens 152_11 and a magnetic lens 152_12. The image plane of projection lens 152 may be configured to be at detection plane SP3. A first level of imaging magnification from sample surface 7 to transfer plane SP2 may be realized by objective lens 131 and zoom lens 151. A second level of imaging magnification from transfer plane SP2 to detection plane SP3 may be realized by projection lens 152. Total imaging magnification from sample surface 7 to detection plane SP3 may be equal to the product of the first level of imaging magnification and the second level of imaging magnification. In some embodiments, the second level of imaging magnification may be configured to be larger than the first level of imaging magnification. Setting the second level larger than the first level may be advantageous in some imaging modes, such as slow secondary electron detection mode.

Zoom lens 151 may perform a zoom function. By adjusting focusing powers of lenses 151_11 and 151_12, the first level of imaging magnification may be varied to achieve a desired value of total imaging magnification. Projection lens 152 may perform an anti-rotation function. By adjusting the magnetic field of magnetic lens 152_12 and the focusing power of electrostatic lens 152_11, total image rotation on detection plane SP3 and the second level of imaging magnification may be set to remain constant. Anti-scanning deflection unit 157 may perform an anti-scanning function. By synchronously deflecting the secondary electron beams with deflection scanning unit 132, the displacements of secondary electron spots on detection plane SP3 may be substantially cancelled. Consequently, the corresponding relationship between the plurality of probe spots and the plurality of detection elements may be maintained.

An exemplary operation of detection system 100A-D may include the following. For example, objective lens 131 may focus secondary electron beams 102_1se, 102_2se, and 102_3se generated from probe spots 102_1S, 102_2S, and 102_3S, respectively, and form a first secondary electron image of the three probe spots on image plane SP1_se. Image plane SP1_se may be below zoom lens 151 and may move with changes of operation conditions of objective lens 131. Beam separator 160 may deflect secondary electron beams 102_1se, 102_2se, and 102_3se so that the beams enter secondary imaging system 150 along secondary optical axis 150_1. Zoom lens 151 may then focus secondary electron beams 102_1se, 102_2se, and 102_3se and form a second secondary electron image of the three probe spots on transfer plane SP2. Projection lens 152 may then focus secondary electron beams 102_1se, 102_2se, and 102_3se to form a third secondary electron image of the three probe spots on detection plane SP3.

Zoom lens 151, including first zoom lens 151_11 and second zoom lens 151_12, may be adjusted to achieve a desired imaging magnification between sample 1 and detection plane SP3 when imaging conditions of objective lens 131 and the plurality of beamlets of the primary electron beam change. For example, first zoom lens 151_11 and second zoom lens 151_12 may be adjusted so that pitches of secondary electron beams 102_1se, 102_2se, and 102_3se match pitches of detection elements 140_1, 140_2, and 140_3. Projection lens 152, including magnetic lens 152_12 and electrostatic lens 152_11, may be adjusted to make orientations of secondary electron beams 102_1se, 102_2se, and 102_3se match orientations of detection elements 140_1, 140_2, and 140_3 when the imaging conditions change. Anti-scanning deflection unit 157 may be operated to keep secondary electron beams 102_1se, 102_2se, and 102_3se within detection elements 140_1, 140_2, and 140_3 during operation of deflection scanning unit 132 scanning beamlets 102_1, 102_2, and 102_3 over respective regions on sample 1.

As discussed above, beam separator 160 may be configured to deflect secondary beamlets with a small angle α, for example to minimize dispersion influence. Angle α may be set within 5 to 25 degrees, for example. When separation angle α is small, space for secondary imaging system 150 and primary projection system 130 may be limited. Elements closest to beam separator 160, such as first lens 151_11 of zoom lens 151, may be most affected by such a space constraint. Furthermore, as the two systems become more complex, for example using more and more beamlets and more detection elements, space constraints may become even more acute. Lenses in the two systems may be made smaller, but imaging quality may be degraded. For example, the larger the inner diameter of a lens, the smaller the aberration generated by the lens. Meanwhile, the closer the lens is placed to beam separator 160, the smaller the aberration generated by the lens. Because aberrations generated within secondary imaging system 150 may deteriorate secondary electron collection efficiency and contribute to cross-talk, it may be desirable to minimize aberrations. However, due to packaging constraints, it is difficult to place a lens with a large inner diameter close to beam separator 160. Thus, from the perspective of minimizing aberrations generated in secondary imaging system 150, it is desirable to set separation angle α to be as large as possible so that more space is available for accommodating lenses. Accordingly, there is a trade-off relationship between minimizing dispersion influence from beam separator 160 and minimizing aberrations from secondary imaging system 150. Consequently, separation angle α may be chosen to balance requirements of primary electron image resolution and secondary electron detection efficiency and cross-talk. An electrostatic lens usually takes up less space than a comparable magnetic lens but generates larger aberrations than the magnetic lens. In some embodiments, an electromagnetic compound lens is therefore provided as the first lens of a zoom lens in a secondary imaging system, such as lens 151_11 in zoom lens 151 in FIG. 1C. The electromagnetic compound lens may be made more compact than a conventional magnetic lens with coils, and thus may allow the first lens having low aberrations to be used when a small separation angle α is set, thereby allowing more flexibility to achieve an inspection tool with both low dispersion influence and low aberrations.

The lenses of a zoom lens may typically be electrostatic lenses, because of, for example, space limitations in secondary imaging system 150. As an example, an electrostatic lens may comprise two end electrodes and one or more inner electrodes, and may work as an Einzel lens. In an Einzel lens, the end electrodes at beam entrance and beam exit sides are set at equal potentials, and the one or more inner electrodes may be biased relative to end electrodes positively (i.e., positive mode), negatively (i.e., negative mode), or negatively and positively (i.e., combined mode, which may use two or more inner electrodes). To ensure that secondary imaging system 150 operates at ground potential, end electrodes of Einzel lenses may be set at ground potential.

Generally, a magnetic lens may generate less aberration than an electrostatic lens. However, a conventional magnetic lens with an adjustable focusing power comprises coil windings, thereby making it bulkier. A conventional magnetic lens may not be ideal for situations that involve packaging constraints. Therefore, secondary imaging system 150 may use Einzel lenses in, for example, zoom lens 151.

An Einzel lens may be operated in secondary imaging system 150 in positive mode, negative mode, or combined mode. Absolute voltages in positive mode are higher than in other modes. It may be advantageous to use higher voltages for reducing aberration effects but doing so may contribute to risks of electrical arcing. For example, in secondary imaging system 150, when packaging constraints cause electrically conductive electrodes to be placed close to one another, there may be many arcing paths, and thus, high voltages should be avoided for the sake of electrical safety. Therefore, it may be desirable to operate an Einzel lens in negative mode.

In some embodiments of the present disclosure, one lens in a zoom lens may be an electromagnetic compound lens that includes a magnetic lens and an electrostatic lens. The magnetic lens of the compound lens may include a permanent magnet. The magnetic lens of the compound lens may provide a portion of the total focusing power of the compound lens, while the electrostatic lens makes up the remaining portion of the total focusing power. The electrostatic lens of the compound lens may be operated in positive mode using comparatively lower voltages than a pure Einzel lens. According to some embodiments, aberrations in a zoom lens with an electromagnetic compound lens may be reduced as compared to a typical zoom lens in which all the lenses are electrostatic.

Figure 2A:
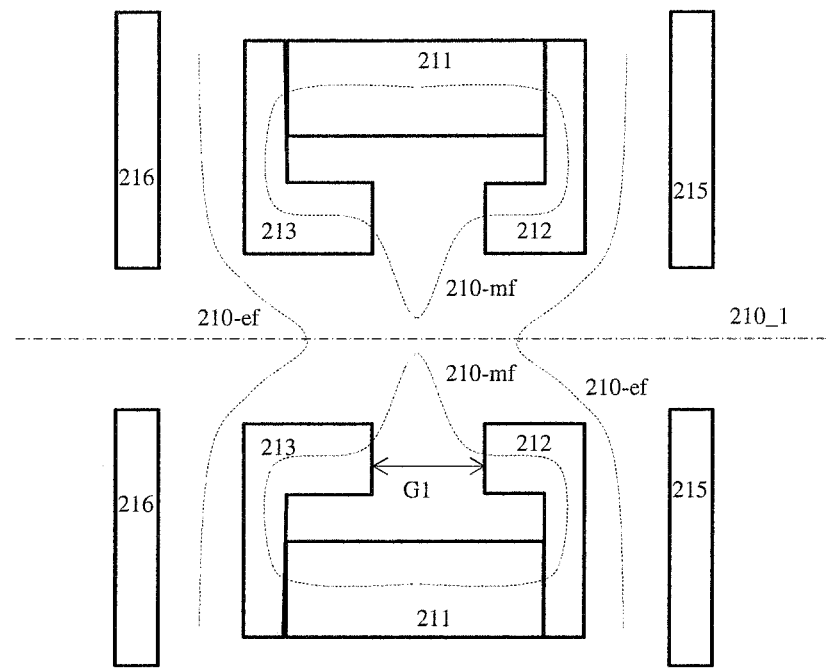
FIGS. 2A to 2C illustrates exemplary configurations of an electromagnetic compound lens that may be part of a secondary imaging system, consistent with embodiments of the present disclosure.

Reference is now made to FIG. 2A, which illustrates an exemplary configuration of an electromagnetic compound lens 210A, consistent with embodiments of the present disclosure. The compound lens of FIG. 2A may form a portion of secondary imaging system 150. For example, compound lens 210A may be provided as first lens 151_11 in zoom lens 151 of secondary imaging system 150 of FIG. 1C. Thus, compound lens 210A may be arranged between beam separator 160 and projection lens 152. Compound lens 210A may be aligned with an axis 210_1, which, in some embodiments, such as when compound lens 210A is provided as first lens 151_11, may be axis 150_1. Compound lens 210A may be rotationally symmetric about axis 210_1.

Compound lens 210A may include a permanent magnet 211, a first magnetic pole piece 212, a second magnetic pole piece 213, a first electrode 215, and a second electrode 216. Magnet 211 may be provided surrounding axis 210_1 and between first magnetic pole piece 212 and second magnetic pole piece 213 along axis 210_1. First and second magnetic pole pieces 212, 213 may be provided between first electrode 215 and second electrode 216 along axis 210_1. The components 211, 212, 213, 215, and 216 may have an annular shape. In comparison to coils, a permanent magnet may take up a smaller space, generate less heat, and does not require connection to a driver, and thus, a permanent magnet may be suitable for placing in a high voltage environment.

Magnet 211 may have a direction of magnetization in a longitudinal direction that may be parallel to axis 210_1. First magnetic pole piece 212 and second magnetic pole piece 213 may be formed with electrically conductive and magnetic material. In some embodiments, one or both of first and second magnetic pole pieces 212, 213 may directly contact magnet 211. A magnetic circuit may be formed by magnet 211, first magnetic pole piece 212, and second magnetic pole piece 213. Magnetic pole pieces 212 and 213 may be provided to shape and direct the magnetic field generated by magnet 211. Magnetic pole pieces 212 and 213 may be provided separately so that they do not physically contact one another.

First and second magnetic pole pieces 212, 213 may form a non-magnetic gap G1. Gap G1 may be formed on a radially inner side of magnet 211 so that magnetic field generated by magnet 211 is directed toward axis 210_1. Gap G1 may sweep out an annular region surrounding axis 210_1. The swept out annular region formed by gap G1 may have an outer diameter less than an inner diameter of magnet 211. Gap G1 may be a free space or may be partially or fully filled with a material that has little to no effect on magnetic fields, i.e. having a magnetic permeability close or equal to 1.

Compound lens 210A includes a magnetic lens that may be formed by magnet 211, first magnetic pole piece 212, and second magnetic pole piece 213. Excitation of the magnetic lens may be provided by magnet 211. Magnetic field 210-$mf$ may emerge through gap G1. FIG. 2A shows magnetic field lines of magnetic field 210-$mf$. Magnetic field may be leaked to an area around axis 210_1 through gap G1 between first and second magnetic pole pieces 212, 213. Thus, electrons traveling through compound lens 210A may be influenced by the magnetic field of the magnetic lens. If one or both of first and second magnetic pole pieces 212, 213 are spaced apart from magnet 211, first and second magnetic pole pieces 212, 213 may have stronger magnetic coupling in the portions spaced apart from magnet 211 than in gap G1. Therefore, the magnetic field may be preferentially leaked through gap G1. In some embodiments, first and second magnetic pole pieces 212, 213 may have different diameters. For example, first magnetic pole piece 212 may have a different inner diameter from second magnetic pole piece 213.

Compound lens 210A includes an electrostatic lens that may be formed by first and second magnetic pole pieces 212, 213, first electrode 215, and second electrode 216. First and second electrodes 215, 216 may form end electrodes. First and second electrodes 215, 216 may be formed with electrically conductive material. Electrical voltages may be applied to components 212, 213, 215, and 216. When two of components 212, 213, 215, and 216 are set at different electrical potentials, an electrostatic field may be generated. For example, in FIG. 2A, first electrode 215 may be set at a potential different from that of first magnetic pole piece 212. Thus, electric field may be formed therebetween. Similarly, second electrode 216 may be set at a potential different from that of second magnetic pole piece 213. Potentials of first and second magnetic pole pieces 212, 213 may be the same. Potentials of first and second electrodes 215, 216 may also be the same (as in an Einzel Lens). FIG. 2A shows equipotential lines of electric field 210-$ef$. Compound lens 210A may be configured to be symmetric about a transverse plane intersecting axis 210_1 in a region of gap G1, for example.

In some embodiments, first magnetic pole piece 212 and second magnetic pole piece 213 may be electrically connected to one another. Thus, first magnetic pole piece 212 and second magnetic pole piece 213 may form a single electrode and a single voltage may be applied to first magnetic pole piece 212 and second magnetic pole piece 213.

Focusing power of compound lens 210A may be adjustable. For example, electric field in the electrostatic lens made up of components 212, 213, 215, and 216 may be adjusted by varying voltages of electrodes in the electrostatic lens. Magnet 211 is a permanent magnet, its magnetization may be fixed, and therefore, the magnetic field generated in a magnetic lens may remain fixed. A focusing power of a compound lens may depend on both a magnetic field and an electric field. Thus, when the magnetic field is fixed, adjustability of the focusing power may be provided via the electrostatic portion of the compound lens.

Compound lens 210A may include an electrostatic lens and a magnetic lens and may be adjustable by virtue of the electrostatic lens. Adjustment of the electrostatic lens may be made by adjusting voltages applied to first electrode 215, second electrode 216, and a central electrode that may include first magnetic pole piece 212 or second magnetic pole piece 213.

Figure 2B:
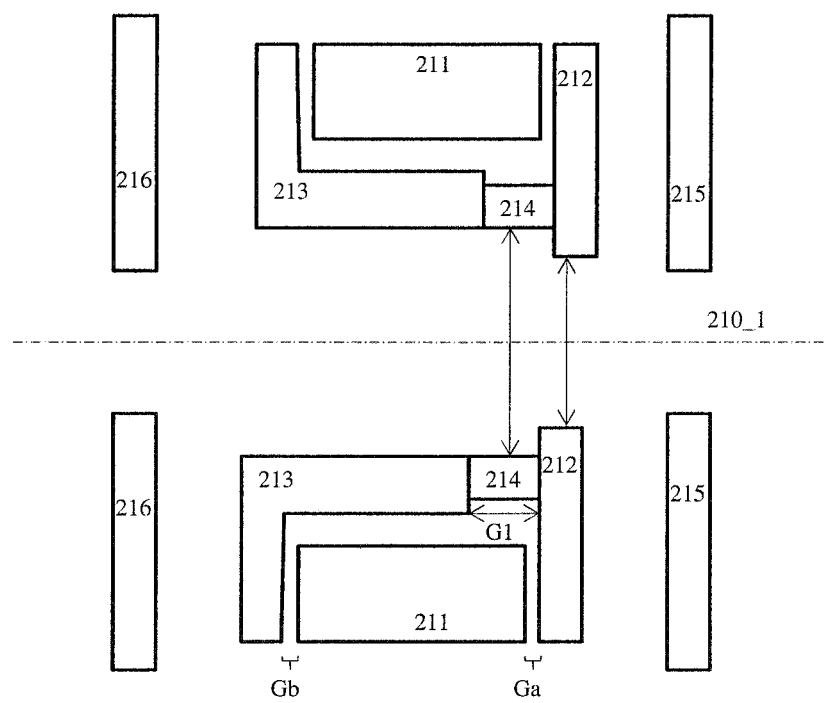

FIG. 2B illustrates another exemplary configuration of a compound lens 210B, consistent with embodiments of the present disclosure. Compound lens 210B may be similar to compound lens 210A discussed above with respect to FIG. 2A, except for the following exemplary differences. Compound lens 210B may include a gap Ga between magnet 211 and first magnetic pole piece 212, and a gap Gb between magnet 211 and second magnetic pole piece 213, each in a direction along axis 210_1. First and second magnetic pole pieces 212, 213 may have stronger magnetic coupling in gaps Ga and Gb than in gap G1. First and second magnetic pole pieces 212, 213 may have different shapes. First magnetic pole piece 212 may have an inner diameter smaller than that of second magnetic pole piece 213. Furthermore, compound lens 210B may include an electrode 214 arranged inside gap G1.

First and second magnetic pole pieces 212, 213 may be shaped such that gap G1 is formed at various positions along axis 210_1. As shown in FIG. 2B, gap G1 may be formed at one end of magnet 211 in the axial direction. Gap G1 may be formed close to the one end of magnet 211. For example, gap G1 may be closer to the one end of magnet 211 than the opposing end of magnet 211 in the direction of axis 210_1. Gap G1 may be positioned so as to be on the entering side of electrons of an electron beam. For example, compound lens 210B may be arranged in a secondary imaging system in a manner so that secondary electrons of a secondary beam are incident from the right-side end in the view depicted in FIG. 2B. Axis 210_1 may be collinear with secondary optical axis 150_1 (see FIG. 1C). The electrons may enter compound lens 210B through an opening in first magnetic pole piece 212. Thus, the electrons may be influenced by a magnetic field emerging from gap G1 shortly after entering compound lens 210B. Positioning gap G1 closer to the end of compound lens 210B where the electrons enter may ensure the magnetic field to influence the electrons early and may reduce aberrations of compound lens 201B.

Electrode 214 may be provided to partially or fully cover gap G1. In some embodiments, electrode 214 may be provided completely within gap G1 and may not extend outside of gap G1. Electrode 214 may be formed with a non-magnetic material. Electrode 214 may be formed with a material that has no or little effect on magnetic fields, so as not to interfere with the magnetic field generated by magnet 211. To avoid charging of magnet 211, electrode 214 may fully block gap G1. Thus, the electrons traveling through compound lens 210B, e.g., along axis 210_1, may be prevented from striking magnet 211. Charges may thereby be prevented from accumulating on magnet 211, and thus, the electrostatic characteristics of an electrostatic lens of compound lens 210B may be prevented from being changed by the charges, and accordingly the focusing power of the electrostatic lens may be kept stable. Furthermore, geometries of components 211, 212, 213 may be configured so as to reduce likelihood of the electrons reaching magnet 211. For example, an annular thickness of magnet 211 may be made smaller than that of first and second magnetic pole pieces 212, 213. In some embodiments, an inner diameter of magnet 211 may be made larger than that of first and second magnetic pole pieces 212, 213. The inner diameter of magnet 211 may be significantly larger than that of first and second magnetic pole pieces 212, 213. Gap G1 may be made smaller than a radial size difference between magnet 211 and first magnetic pole piece 212 (the radial direction being perpendicular to axis 210_1), or smaller than a radial size difference between magnet 211 and second magnetic pole piece 213. In such arrangements, the likelihood of the electrons traveling through compound lens 210B reaching magnet 211 may be reduced.

Compound lens 210B may include an electrostatic lens and a magnetic lens. The magnetic lens of compound lens 210B may be formed by components 211, 212, 213. A magnetic field generated by components 211, 212, 213 may be leaked out through gap G1 to influence electrons traveling along axis 210_1. The electrostatic lens of compound lens 210B may be formed by components 212, 213, 214, 215, and 216. Along with first electrode 215 and second electrode 216, a third electrode may be provided in the electrostatic lens of compound lens 210B. The third electrode may include electrode 214. Electrode 214 may directly contact one or both of first and second magnetic pole pieces 212, 213. In some embodiments, the electrostatic lens and the magnetic lens of compound lens 210B may be formed with common components. For example, first magnetic pole piece 212 and second magnetic pole piece 213 may be constituent components of both the electrostatic lens of compound lens 210B and the magnetic lens of compound lens 210B. In other embodiments, for example as shall be discussed later, components of the electrostatic lens and the magnetic lens may be mutually exclusive.

In some embodiments, electrode 214 may have an inner diameter that is the same or different from first magnetic pole piece 212 or second magnetic pole piece 213. For example, as shown in FIG. 2B, electrode 214 has an inner diameter D1 larger than an inner diameter D2 of first magnetic pole piece 212. Furthermore, electrode 214 may be arranged so that gaps are formed between first magnetic pole piece 212 and electrode 214, or between second magnetic pole piece 213 and electrode 214.

Figure 2C:
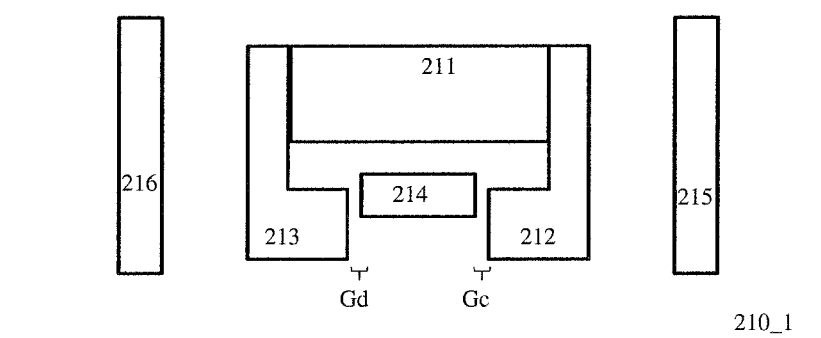
Figure 2C:
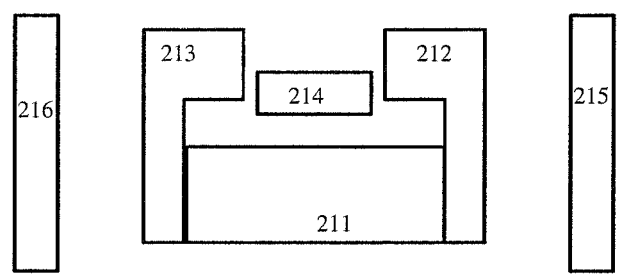

FIG. 2C illustrates another exemplary configuration of a compound lens 210C, consistent with embodiments of the present disclosure. Compound lens 210C may be similar to compound lens 210A and compound lens 210B discussed above, except for the following exemplary differences. Compound lens 210C may include electrode 214 arranged inside gap G1. Compound lens 210C may include a gap Gc between electrode 214 and first magnetic pole piece 212, and a gap Gd between electrode 214 and second magnetic pole piece 213, each in a direction along axis 210_1. Electrode 214 may have an inner diameter larger than each of first and second magnetic pole pieces 212, 213. Compound lens 210C may be configured so that electrons have a low likelihood of striking magnet 211.

Figure 3A:
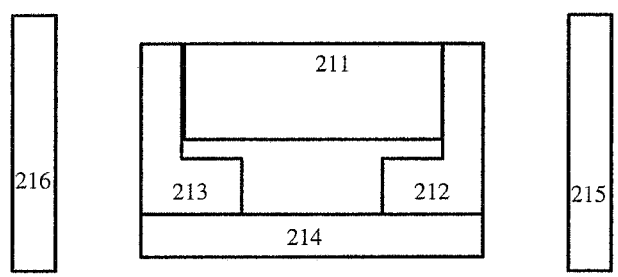
FIGS. 3A and 3B illustrate other exemplary configurations of an electromagnetic compound lens, consistent with embodiments of the present disclosure.
Figure 3A:
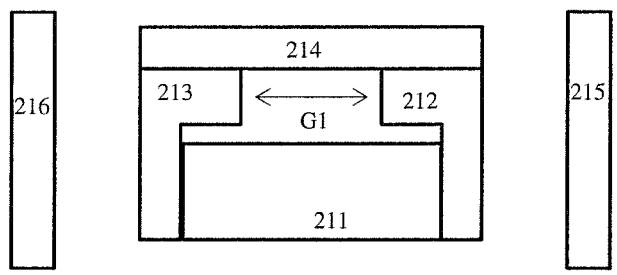

Reference is now made to FIG. 3A, which illustrates an exemplary configuration of a compound lens 220A, consistent with embodiments of the present disclosure. Compound lens 220A may include electrode 214 that covers first and second magnetic pole pieces 212, 213. Electrode 214 may cover inner surfaces of first and second magnetic pole pieces 212, 213 that face axis 210_1. Electrode 214 may extend from an end of first magnetic pole piece 212 to an end of second magnetic pole piece 213 along axis 210_1. Electrode 214 may cover substantially all of inner surfaces of first and second magnetic pole pieces 212, 213 facing axis 210_1.

In compound lens 220A, first magnetic pole piece 212 and second magnetic pole piece 213 may be formed with magnetically conductive and electrically non-conductive material. The material of one or both of first and second magnetic pole pieces 212, 213 may be an electrical insulator. Electrode 214 may be formed with a non-magnetic material.

Compound lens 220A may include an electrostatic lens and a magnetic lens. The magnetic lens of compound lens 220A may be formed by components 211, 212, 213. A magnetic field generated by components 211, 212, 213 may be leaked out through gap G1 to influence electrons traveling along axis 210_1. The electrostatic lens of compound lens 220A may be formed by components 214, 215, and 216. Electrode 214 may directly contact one or both of first and second magnetic pole pieces 212, 213. In some embodiments, gaps may be provided between electrode 214 and first and second magnetic pole pieces 212, 213. For example, electrode 214 may be spaced apart from first and second magnetic pole pieces 212, 213 in the radial direction. An electric field may be generated in compound lens 220A by setting two components among components 214, 215, and 216 at different potentials.

Compound lens 220A may allow for improved design flexibility. For example, an electric field may be generated by components with electrically conductive properties, such as electrode 214, first electrode 215, and second electrode 216. Because first and second magnetic pole pieces 212, 213 need not be formed of electrically conductive material for forming an electrostatic lens, greater flexibility may be afforded in choosing materials to build compound lens 220A.

Figure 3B:
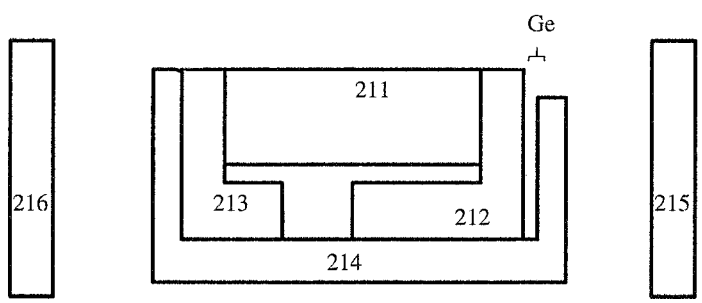
Figure 3B:
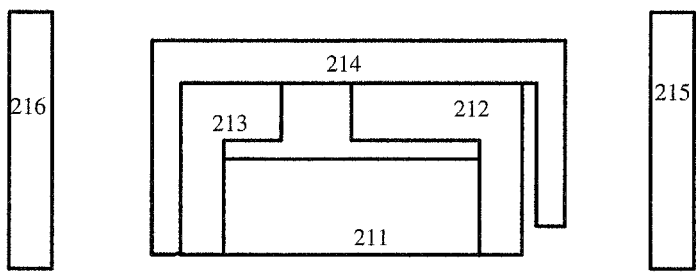

FIG. 3B illustrates another exemplary configuration of a compound lens 220B, consistent with embodiments of the present disclosure. Compound lens 220B may be similar to compound lens 220A discussed above with respect to FIG. 3A, except for the following exemplary differences. Compound lens 220B may include electrode 214 having a shape that substantially covers first magnetic pole piece 212, second magnetic pole piece 213, and magnet 211. Electrode 214 may encircle first magnetic pole piece 212, second magnetic pole piece 213, and magnet 211. Electrode 214 may have a shape that comprises a substantially U-shaped ring. For example, electrode 214 may include a cross sectional U-shape that is rotationally symmetric about axis 210_1. Electrode 214 may include a portion that covers first and second magnetic pole pieces 212, 213 in the longitudinal direction, i.e., along axis 2101, and a portion that covers first and second magnetic pole pieces 212, 213 in the radial direction. Electrode 214 may cover inner surfaces of first and second magnetic pole pieces 212, 213 that face axis 210_1. Electrode 214 may extend from an end of first magnetic pole piece 212 to an end of second magnetic pole piece 213 along axis 210_1. Electrode 214 may also cover end surfaces of first and second magnetic pole pieces 212, 213. Electrode 214 may cover three peripheral sides around first magnetic pole piece 212, second magnetic pole piece 213, and magnet 211. For example, electrode 214 may cover an axial inner side and radial outside end sides of the group of components 211, 212, and 213. In some embodiments, electrode 214 may cover further sides around first magnetic pole piece 212, second magnetic pole piece 213, and magnet 211, such as an axial outer side. Electrode 214 may completely encircle first magnetic pole piece 212, second magnetic pole piece 213, and magnet 211.

In some embodiments, electrode 214 may be provided with gaps between electrode 214 and components that electrode 214 covers. Electrode 214 may directly contact one or both of first and second magnetic pole pieces 212, 213. For example, electrode 214 may be spaced apart from first magnetic pole piece 212 in the direction along axis 210_1 by gap Ge and may contact secondary magnetic pole piece 213.

In some embodiments, a compound lens may be used as a lens in a zoom lens. A zoom lens may have adjustable focusing power so that electrons traveling therethrough may be controlled appropriately. For example, a zoom lens may be used to reduce cross-talk among multiple detection elements. As such, the zoom lens may be configured to prevent spots of secondary electron beams from overlapping or from impinging on neighboring detection elements of the detection device. The zoom lens may be configured to make the spot size of each secondary electron beam smaller than its corresponding electron detection element. Furthermore, a zoom lens may be configured to compensate for variations of objective lens 131 in focusing influence. A lens, such as compound lens 210A, 210B, 210C, 220A, or 220B may be configured to be adjustable by way of an adjustable electrostatic lens to meet different imaging conditions.

Reference is now made to FIG. 4A, which illustrates an exemplary configuration of first lens 151-11A in a secondary imaging system of an electron beam tool, consistent with embodiments of the present disclosure. First lens 151-11A may include an electromagnetic compound lens such as those discussed above with reference to FIGS. 2A-2C and FIGS. 3A-3B. First lens 151-11A may be applied as part of zoom lens 151 of secondary imaging system 150 discussed above with reference to FIG. 1C. First lens 151-11A may be configured to focus secondary electron beams 102_1se, 102_2se, and 102_3se that are deflected away from primary optical axis 100_1 to travel along secondary optical axis 150_1.

As shown in FIG. 4A, first lens 151-11A includes permanent magnet 211, first magnetic pole piece 212, second magnetic pole piece 213, electrode 214, first end-shielding electrode 217, and second end-shielding electrode 218. Components 211, 212, 213, 214, 217, and 218 may be aligned with secondary optical axis 150_1. First end-shielding electrode 217 may include a part 217a covering magnet 211 from outside to magnetically shield magnet 211. In such a way, the magnetic field generated by magnet 211 may not leak to primary optical axis 100_1.

First and second magnetic pole pieces 212, 213 may be formed with electrically conductive and magnetic material. In some embodiments, first and second magnetic pole pieces 212, 213 may be electrical insulators. Electrode 214 may be formed with electrically conductive and non-magnetic material. First and second end-shielding electrodes 217, 218 may be formed with electrically and magnetically conductive material.

First lens 151-11A may include a magnetic lens 151-11m that may be formed by magnet 211, first magnetic pole piece 212, and second magnetic pole piece 213. Excitation of magnetic lens 151-11m may be provided by magnet 211. A magnetic field may emerge through a gap between first and second magnetic pole pieces 212, 213. Electrode 214 may be provided in the gap and may shield magnet 211 from being charged by incoming secondary electrons.

First lens 151-11A may include an electrostatic lens 151-11e that may be formed by first and second magnetic pole pieces 212, 213, electrode 214, first end-shielding electrode 217, and second end-shielding electrode 218. In some embodiments, electrostatic lens 151-11e may be formed by only electrode 214, first end-shielding electrode 217, and second end-shielding electrode 218. First and second end-shielding electrodes 217, 218 may be set at a first potential V1, and first magnetic pole piece 212, second magnetic pole piece 213, and electrode 214 may be set at a second potential V2 that may be different from V1. Thus, an electrostatic field may be generated.

A focusing power of first lens 151-11A may be adjustable. In some embodiments, the focusing power may be configured to be adjusted by varying second potential V2. First and second end-shielding electrodes 217, 218 may directly contact one another and may be electrically connected. In some embodiments, first and second end-shielding electrodes 217, 218 may be spaced apart from one another and may be electrically disconnected. First end-shielding electrode 217 may be controlled with a voltage independent of second end-shielding electrode 218.

First lens 151-11A may be used as the first lens of a zoom lens counting from the side of secondary beams entering the zoom lens. A focusing power of first lens 151-11A may be configured to adjust in a range in accordance with, for example, changes in imaging conditions of objective lens 131 and landing energy of primary electron beamlets. First lens 151-11A may include magnetic lens 151-11m and electrostatic lens 151-11e that may be configured to satisfy the range. Substantially all or a part of the base portion of the range may be realized by magnetic lens 151-11m. The remaining portion of the range may be realized by electrostatic lens 151-11e.

Electrostatic lens 151-11e may be configured to supply variable focusing power by an electric field generated therein. Electrostatic lens 151-11e may work as an Einzel lens and be operated in positive mode, negative mode, or combined mode. In positive mode, first and second end-shielding electrodes 217, 218 may be set to equal potentials (e.g., V1), and an inner electrode may be set to a higher potential (e.g., V2, where V2>V1). The inner electrode of electrostatic lens 151-11e may include first magnetic pole piece 212, second magnetic pole piece 213, and electrode 214, or electrode 214 alone, for example. In negative mode or combined mode, first and second end-shielding electrodes 217, 218 may be set to equal potentials (V1) that are higher than the potential (V2) of the inner electrode. The absolute value of V2-V1 in positive mode is larger than in negative mode when realizing an equal focusing power applied to a beam.

As an example, in positive mode, the inner electrodes 212, 213 and 214 may need to be biased 40 kV with respect to the end electrodes 217 and 218 to realize a desired focusing power, i.e., absolute value of V2-V1 is 40 kV. In negative mode, the inner electrodes may need to be biased −20 kV with respect to the end electrodes 217 and 218 to realize the desired focusing power, i.e., absolute value of V2-V1 is 20 kV.

Operating an electrostatic lens in positive mode may reduce aberration. However, operating in positive mode may require applying relatively high voltages and the risk of electrical arcing may be unacceptably high in an arrangement of components in a compact space. An electromagnetic compound lens that supplies a fixed part of its focusing power by a magnetic lens and a changeable part of its focusing power by an electrostatic lens may allow operation in positive mode while reducing overall applied voltage. For example, with reference to the example described above, a compound lens may be provided that includes a magnetic lens that supplies some of the focusing power for focusing a beam. Thus, a lower value of voltages may be used for operating the electrostatic lens portion of the compound lens. Accordingly, smaller voltages as compared to, for example, 40 kV, may be used.

In some embodiments, first and second end-shielding electrodes 217, 218 may be set at ground potential so that V1=0. Setting V1=0 may be advantageous in terms of improved electrical safety and reducing requirements for insulation complexity. Electrode 214 may be set at a potential V2 that is higher than V1 (positive mode). Setting V2 higher than V1 may be advantageous for reducing aberration.

As discussed above, first lens 151-11A may be a compound lens that includes magnetic lens 151-11*m* and electrostatic lens 151-11*e*. A magnetic field generated by magnetic lens 151-11*m* may be represented by B151. An electric field generated by electrostatic lens 151-11*e* may be represented by E151. Focusing power of first lens 151-11A may be dependent on electric field strength E151 and magnetic field B151.

Electric and magnetic field centers may be coincident. In some embodiments the centers of distribution of fields B151 and E151 may be at different positions. Permeabilities of first magnetic pole piece 212 and second magnetic pole piece 213 may be different, for example.

In some embodiments, first and second end-shielding electrodes 217, 218 may form a magnetic shield. First and second end-shielding electrodes 217, 218 may be configured to prevent a magnetic field generated by magnet 211 from leaking to an area around primary optical axis 100_1. Electromagnetic shielding may be provided around first lens 151-11A so that stray fields generated from first lens 151-11A do not disturb trajectories of primary beamlets 102_1, 102_2, and 102_3, which travel along primary optical axis 100_1. In some embodiments, a magnetic shielding or magnetic and electric shielding tube may be provided, and may be centered around primary optical axis 100_1, similar to shielding tube 219 of FIGS. 4B and 4C.

Figure 4B:
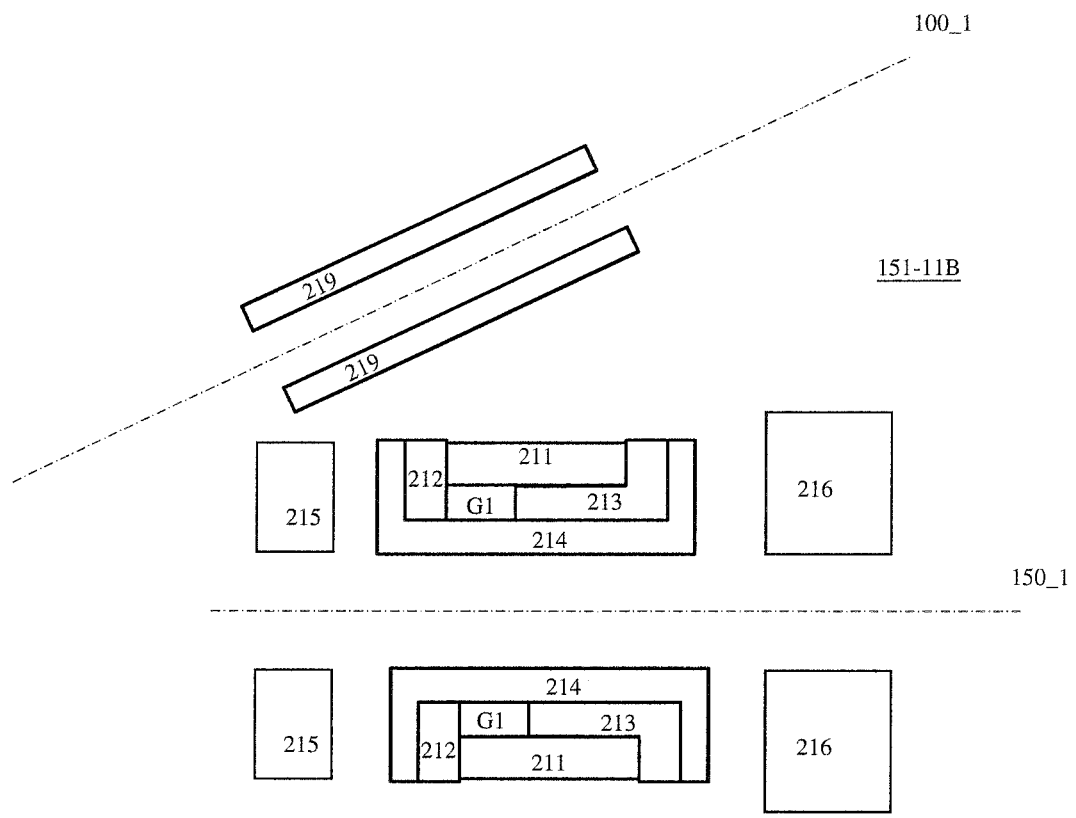
FIGS. 4B, and 4C illustrate other exemplary configurations of a lens and a field shielding tube that may be respectively used in a primary projection system and a secondary imaging system of an EBI system, consistent with embodiments of the present disclosure.

FIG. 4B illustrates another exemplary configuration of a first lens 151-11B in a secondary imaging system of an electron beam tool, consistent with embodiments of the present disclosure. First lens 151-11I B may be similar to first lens 151-11A discussed above with respect to FIG. 4A, except for the following exemplary differences. First lens 151-11B may include first electrode 215 and second electrode 216. First electrode 215 and second electrode 216 may be formed in the shape of annular discs including an aperture at their centers, and being made of electrically conductive material. First lens 151-11B includes an electrostatic lens that may be formed by first electrode 215, second electrode 216, and electrode 214. First and second electrodes 215, 216 may form end electrodes.

A shielding tube 219 may be provided around primary optical axis 100_1 of the electron beam tool. Shielding tube 219 may prevent stray fields generated from first lens 151-11B from disturbing trajectories of primary beamlets 102_1, 102_2, and 102_3 travelling along primary optical axis 100_1. Shielding tube 219 may be a magnetic shielding tube that impedes permeation of magnetic field from an exterior thereof to an interior thereof.

Figure 4C:
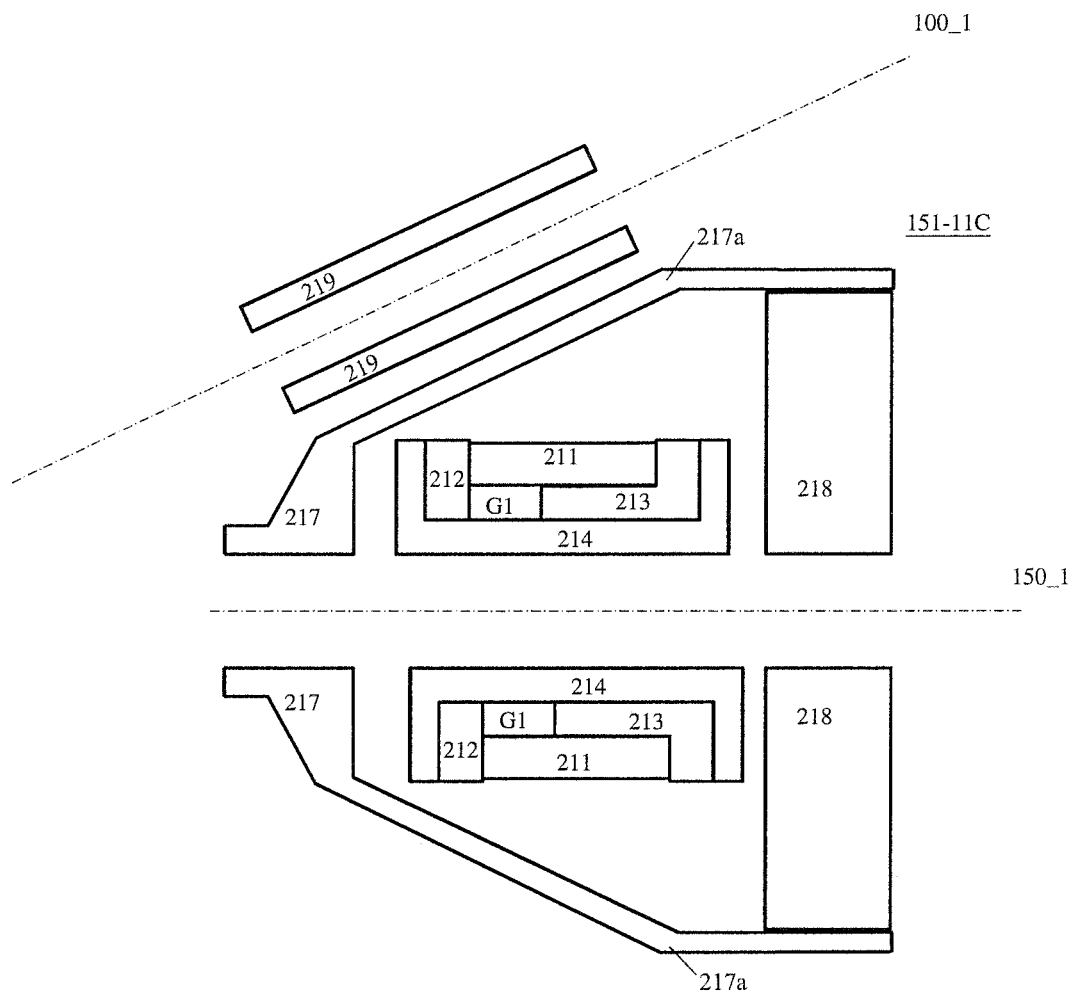

FIG. 4C illustrates another exemplary configuration of a first lens 151-11C in a secondary imaging system of an electron beam tool, consistent with embodiments of the present disclosure. First lens 151-11C may be similar to first lens 151-11A and first lens 151-11B discussed above, except for the following exemplary differences. First lens 151-11C may include first and second end-shielding electrodes 217, 218 and shielding tube 219. All of first and second end-shielding electrodes 217, 218 and shielding tube 219 or only shielding tube 219 may form a magnetic shield to prevent stray fields from disturbing trajectories of primary beamlets 102_1, 102_2, and 102_3 travelling along primary optical axis 100_1.

Sizes and shapes of various components in apparatus 100A of FIG. 1B may be configured so as to be packaged into constrained spaces. For example, first end-shielding electrode 217 may be formed in a cone shape. An electrode having a cone-shaped end may be advantageous for arranging in an area between primary optical axis 100_1 and secondary optical axis 150_1. In secondary imaging system 150 of FIG. 1C, zoom lens 151 may be the first electron optical element provided after beam separator 160 along a path toward electron detection device 140M. Therefore, space constraints for zoom lens 151 may be the most acute.

Zoom lens 151 may be provided in a space between beam separator 160 and electron detection device 140M. In some embodiments, zoom lens 151 may be provided immediately downstream of beam separator 160. Zoom lens 151 may be provided in a path from beam separator 160 to electron detection device 140M along secondary optical axis 150_1 without any intervening elements between beam separator 160 and zoom lens 151.

When separation angle α is small (see FIG. 1B), space between primary optical axis 100_1 and secondary optical axis 150_1 is limited. However, it may be desirable to arrange a lens as close as possible to beam separator 160. For example, secondary beams generated from sample 1 directed toward electron detection device 140M may be diverging. Shortening the distance between beam separator 160 and zoom lens 151 in secondary imaging system 150 may reduce the sizes of secondary beams in zoom lens 151, and thus, may reduce aberrations of zoom lens 151 and prevent beam spots on detection elements 140_1, 140_2, and 140_3 from becoming enlarged. Additionally, aberration and other influences having deleterious effects on imaging quality may propagate through an optical system and be magnified, and thus, it may be desirable to use a lens having low aberration as the first lens in secondary imaging system 150.

A permanent magnet, such as magnet 211, avoids cost and complexity associated with conventional coil windings that need electrical current applied to them. A permanent magnet may save power and avoid heating issues. A permanent magnet may be smaller than a comparable electromagnet for providing the same magnetic field strength. A permanent magnet may have high magnetic field stability and low field noise. A material for a permanent magnet may include a rare earth metal, such as neodymium.

Figure 5:
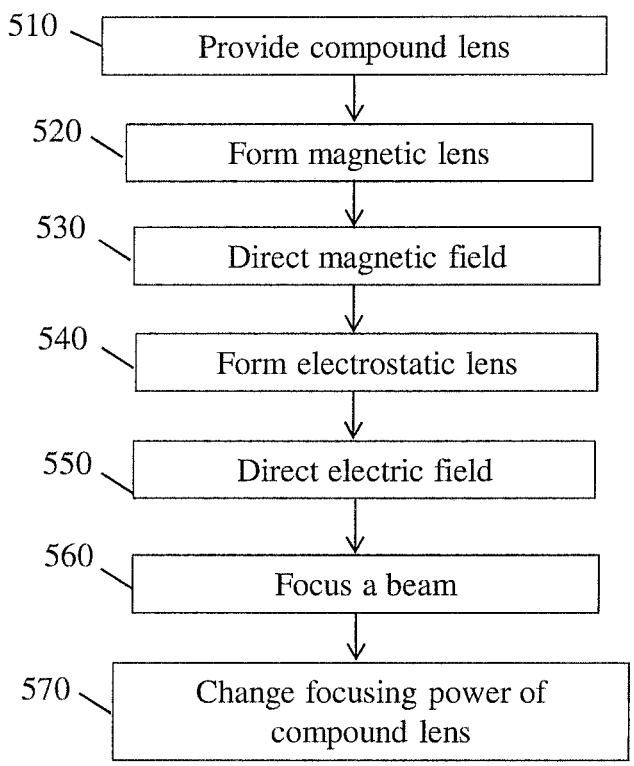
FIG. 5 is a flowchart representing an exemplary method of configuring an electromagnetic compound lens, consistent with embodiments of the present disclosure.

In some embodiments, there may be provided a method to configure an electromagnetic compound lens with an optical axis. FIG. 5 is a flowchart illustrating an exemplary method 500 for configuring an electromagnetic compound lens, consistent with embodiments of the present disclosure. In step 510, an electromagnetic compound lens, such as compound lens 210A in FIG. 2A, may be provided. The compound lens may be provided in an electron beam tool, such as apparatus 100A in FIG. 1B that may be part of an EBI system such as 10 in FIG. 1A. In some embodiments, the compound lens may be provided as a lens of a zoom lens in a secondary imaging system of the electron beam tool. For example, a compound lens may be provided as a first lens 151_11 of zoom lens 151 in secondary imaging system 150 in FIG. 1C, such as the first lens 151-11A in FIG. 4A.

In step 520, a magnetic lens of the compound lens may be formed. For example, step 520 may include forming magnetic lens 151-11*m* of the compound lens 151-11A in FIG. 4A. The magnetic lens may be formed by an annular permanent magnet surrounding an optical axis of the compound lens. In some embodiments, step 520 may include further providing a first magnetic pole piece and a second magnetic pole piece to sandwich the permanent magnet along the optical axis. For example, the magnetic lens 151-11*m* may be formed by first magnetic pole piece 212, second magnetic pole piece 213, and permanent magnet 211.

In step 530, a magnetic field formed by the magnetic lens may be directed toward the optical axis. For example, first magnetic pole piece 212 and second magnetic pole piece 213 (which may shape and direct the magnetic field originally generated by magnet 211) may be provided with a gap through which the magnetic field generated by magnet 211 is directed toward secondary optical axis 150_1, as in FIG. 4A.

In step 540, an electrostatic lens of the compound lens may be formed. For example, step 540 may include forming electrostatic lens 151-11*e* of the compound lens 151-11A in FIG. 4A. The electrostatic lens may be formed by two end electrodes and an inner electrode. The two end electrodes may sandwich the inner electrode in the direction of the optical axis of the compound lens. The inner electrode may be formed by the magnetic pole pieces or a separate electrode. As one example, electrostatic lens 151-11*e* of compound lens 151-11A may be formed with first end-shielding electrode 217, second end-shielding electrode 218, and an inner electrode that is formed by first and second magnetic pole pieces 212, 213 and electrode 214.

In step 550, an electrostatic field formed by the electrostatic lens may be directed toward the optical axis of the compound lens. For example, the electrostatic field of electrostatic lens 151-11*e* may be generated along the optical axis of compound lens 151-11A between first and second end-shielding electrodes 217 and 218 by setting first and second end-shielding electrodes 217 and 218 at one potential and the inner electrode at another different potential.

In step 560, an electron beam traveling through the compound lens may be focused. Focusing of the beam may include adjusting a focusing power of the compound lens to focus the beam onto a plane. For example, zoom lens 151 of secondary imaging system 150, which may include the compound lens, may be adjusted according to imaging conditions of objective lens 131 and landing energy of primary electron beamlets 102_1, 102_2, and 102_3 to focus secondary electron beams 102_1*se*, 102_2*se*, and 102_3*se* to imaging plane SP2, as in FIG. 1C.

In step 570, the focusing power of the compound lens may be changed. Step 570 may include adjusting the focusing power of the compound lens based on changes in imaging conditions. For example, compound lens 151-11A in secondary imaging system 150 in FIG. 4A, may be adjusted according to imaging conditions of objective lens 131 and landing energy of primary electron beamlets 102_1, 102_2, and 102_3.

Figure 6:
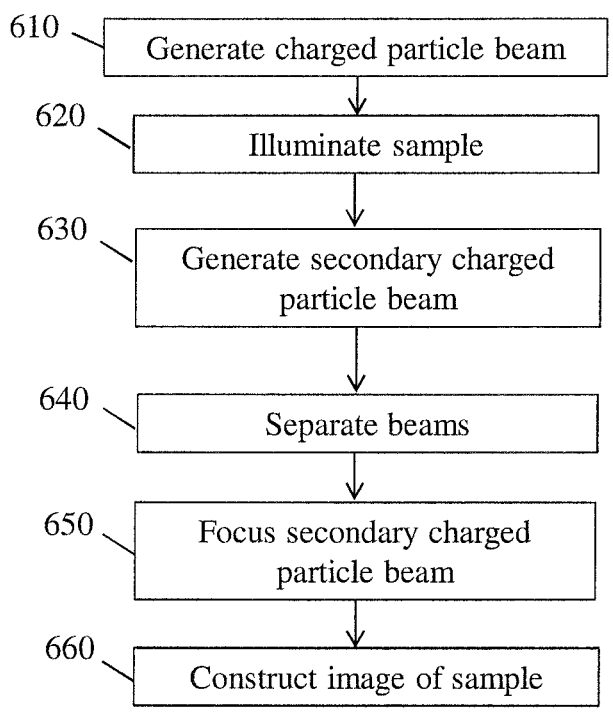
FIG. 6 is a flowchart representing an exemplary method of configuring a charged particle beam apparatus, consistent with embodiments of the present disclosure.

FIG. 6 is a flowchart illustrating an exemplary method 600 for configuring a charged particle beam apparatus, consistent with embodiments of the present disclosure. Method 600 may be performed by controller 19 of EBI system 10, as shown in FIG. 1A, for example. Controller 19 may be programmed to implement one or more blocks of method 600. For example, controller 19 may instruct a module of a charged particle beam apparatus to generate a charged particle beam and to carry out other functions.

In step 610, a charged particle beam may be generated by a charged particle source. For example, electron source 101 may be controlled to emit primary electron beam 102 that is formed along primary optical axis 100_1, as in FIG. 1B. Step 610 may include generating a plurality of beamlets from the charged particle beam. For example, source conversion unit 120 may form a 3×3 array of primary beamlets, including primary beamlets 102_1, 102_2, 102_3 from primary electron beam 102.

In step 620, the primary beamlets may be directed to a sample where secondary electrons may be generated. For example, in FIG. 1B, primary beamlets 102_1, 102_2, 102_3 may travel along primary optical axis 100_1 and be focused to form probe spots 102_1S, 102_2S, and 102_3S on surface 7 of sample 1.

In step 630, secondary charged particles may be generated from the sample by a primary beamlet, and form a secondary charged particle beam. For example, in FIG. 1B, in response to illumination by primary beamlets 102_1, 102_2, 102_3, secondary electron beams 102_1*se*, 102_2*se*, and 102_3*se* may be generated and may be emitted from sample 1 to travel in a reverse direction along primary optical axis 100_1.

In step 640, a secondary charged particle beam may be separated from a primary beamlet. For example, in FIG. 1B, secondary electron beams 102_1*se*, 102_2*se*, and 102_3*se* may be separated from primary beamlets 102_1, 102_2, 102_3 by beam separator 160. As discussed above, beam separator 160 may be a deflection device that includes a magnetic deflector, such as a Wien filter. The deflection device may deflect charged particles passing therethrough. The deflection directions and deflection angles of the electrons may depend on the movement directions and energies (which may be represented by, e.g., velocities) of the charged particles. Thus, primary charged particle moving in a direction different from secondary charged particles may be distinguished from secondary charged particles. Accordingly, for example, primary beamlets 102_1, 102_2, and 102_3 may be allowed to pass substantially straight through beam separator 160 while secondary electron beams 102_1*se*, 102_2*se*, and 102_3*se* are deflected away from optical axis 100_1, as in FIG. 1B. Secondary electron beams 102_1*se*, 102_2*se*, and 102_3*se* may be directed to travel along secondary optical axis 150_1.

In step 650, the secondary charged particle beams may be focused and detected. For example, in FIG. 1B, secondary electron beams may be focused by a secondary imaging system 150 and detected by electron detection device 140M. Zoom lens 151 of secondary imaging system 150, which may include a compound lens, may be adjusted according to imaging conditions of objective lens 131 and landing energy of primary electron beamlets 102_1, 102_2, and 102_3 to focus the secondary electron beams 102_1*se*, 102_2*se* and 102_3*se* on electron detection device 140M.

In step 660, an image of a sample may be constructed. For example, detection elements 140_1, 140_2, and 140_3 may detect corresponding secondary electron beams 102_1*se*, 102_2*se*, and 102_3*se* and generate corresponding signals that may be sent to signal processing units to construct images of the corresponding scanned areas of sample 1.

The embodiments may further be described using the following clauses:

1. An electromagnetic compound lens comprising:
   an electrostatic lens provided on an optical axis of the compound lens; and
   a magnetic lens provided on the axis, wherein the magnetic lens includes an annular permanent magnet surrounding the optical axis.

2. The compound lens of clause 1, further comprising:
a first magnetic pole piece and a second magnetic pole piece, the permanent magnet being between the first magnetic pole piece and the second magnetic pole piece along the optical axis, wherein an annular gap is formed between the first magnetic pole piece and the second magnetic pole piece so that a magnetic field originally generated by the permanent magnet is directed to leak through the gap toward the optical axis.

The compound lens of clause 2, wherein the gap is formed on a radially inner side of the permanent magnet.

3. The compound lens of clause 2 or clause 3, wherein the gap is formed close to one end of the permanent magnet along the optical axis.

4. The compound lens of any one of clauses 2 to 4, wherein the first magnetic pole piece and the second magnetic pole piece directly contact the permanent magnet.

5. The compound lens of any one of clauses 2 to 5, wherein an inner diameter of the first magnetic pole piece is different from an inner diameter of the second magnetic pole piece.

6. The compound lens of any one of clauses 2 to 6, wherein the electrostatic lens comprises a first electrode and a second electrode, wherein the first magnetic pole piece and the second magnetic pole piece are between the first electrode and the second electrode along the optical axis.

The compound lens of any one of clauses 2 to 6, wherein the first magnetic pole piece is a first electrode of the electrostatic lens and the second magnetic pole piece is a second electrode of the electrostatic lens.

7. The compound lens of clause 7 or clause 8, wherein the electrostatic lens further comprises a third electrode between the first electrode and the second electrode along the optical axis.

8. The compound lens of clause 9, wherein the third electrode is provided in the gap.

9. The compound lens of clause 10, wherein the third electrode is provided completely within the gap.

10. The compound lens of clause 9 or clause 10, wherein the third electrode has an inner diameter smaller than an inner diameter of the first magnetic pole piece and an inner diameter of the second magnetic pole piece.

11. The compound lens of any one of clauses 9, 10, and 12, wherein the third electrode covers inner surfaces of the first magnetic pole piece and the second magnetic pole piece facing the optical axis.

12. The compound lens of any one of clauses 9, 10, 12, and 13, wherein the third electrode extends from an end of the first magnetic pole piece to an end of the second magnetic pole piece along the optical axis.

13. The compound lens of any one of clauses 9, 10, and 12 to 14, wherein the third electrode encircles the first magnetic pole piece, the second magnetic pole piece, and the magnet.

14. A charged particle optical system comprising:
a beam separator provided on a first optical axis, the beam separator configured to separate a plurality of beamlets of a primary charged particle beam generated by a source from a plurality of secondary charged particle beams emitted from a sample in response to illuminations of the beamlets, wherein secondary charged particle beams travel along a second optical axis after passing through the beam separator;
a secondary imaging system configured to focus the secondary charged particle beams onto a detector along the second optical axis, wherein
the secondary imaging system includes an electromagnetic compound lens comprising:
an electrostatic lens provided on the second optical axis; and
a magnetic lens provided on the second optical axis, wherein the magnetic lens includes an annular permanent magnet.

15. The system of clause 16, wherein the compound lens is a part of a zoom lens in the secondary imaging system.

16. The system of clause 16 or clause 17, wherein the compound lens further comprises:
a first magnetic pole piece and a second magnetic pole piece sandwiching the permanent magnet along the second optical axis, wherein a gap is formed between the first magnetic pole piece and the second magnetic pole piece so that a magnetic field originally generated by the permanent magnet is directed and leaked through the gap toward the second optical axis.

17. The system of clause 18, wherein the gap is formed close to one end of the permanent magnet along the second optical axis.

18. The system of clause 18 or clause 19, wherein the first magnetic pole piece and the second magnetic pole piece directly contact the permanent magnet.

19. The system of any one of clauses 18 to 20, wherein an inner diameter of the first magnetic pole piece is different from an inner diameter of the second magnetic pole piece.

20. The system of any one of clauses 18 to 21, wherein the electrostatic lens comprises a first electrode, a second electrode, and a third electrode, wherein the third electrode is between the first electrode and the second electrode along the second optical axis.

21. The system of clause 22, wherein the third electrode includes the first magnetic pole piece and the second magnetic pole piece.

22. The system of clause 22 or clause 23, wherein the first electrode and the second electrode form a magnetic shielding around the magnetic lens.

23. The system of any one of clauses 22 to 24, wherein a first voltage is applied to the first electrode and the second electrode, and a second voltage is applied to the third electrode, the second voltage being higher than the first voltage.

24. The system of any one of clauses 16 to 25, further comprising a magnetic shielding tube surrounding the first optical axis so as to block the magnetic field of the magnetic lens being leaked toward the first optical axis.

25. The system of any one of clauses 16 to 26, wherein the compound lens is provided immediately downstream of the beam separator.

26. A method to configure an electromagnetic compound lens with an optical axis, comprising:
forming a magnetic lens with a permanent magnet;
using two magnetic pole pieces to direct a magnetic field of the magnetic lens toward the optical axis; and
forming an electrostatic lens with two end electrodes surrounding the two magnetic pole pieces along the optical axis.

27. The method of clause 28, wherein the two magnetic pole pieces are electrodes of the electrostatic lens.

28. The method of clause 29, further comprising providing an inner electrode between the two end electrodes.

29. The method of clause 30, wherein the inner electrode covers inner surfaces of two magnetic pole pieces.

30. The method of any one of clauses 28 to 31, further comprising changing a focusing power of the compound lens by varying an electrostatic field of the electrostatic lens.

31. A method to configure a charged particle beam apparatus, comprising
separating a primary charged particle beam and a secondary charged particle beam;

focusing the secondary charged particle beam by an electromagnetic compound lens including a permanent magnet; and magnetically shielding a magnetic field of the permanent magnet from influencing the primary charged particle beam.

34. The method of clause 33, further comprising changing a focusing power of the electromagnetic compound lens by varying an electrostatic field thereof.

In some embodiments, a controller may be provided to control a charged particle beam system. For example, FIG. 1A illustrates controller 19 connected to EBI system 10. The controller may instruct components of the charged particle beam system to perform various functions, such as controlling a charged particle source to generate a charged particle beam, controlling a deflector to scan the charged particle beam across a sample, and controlling drivers to apply voltages to lenses. The controller may also perform various post-processing functions, image acquisition, image subdivision, image processing, generating contours, superimposing indicators on an acquired image, and the like. The controller may comprise a storage that is a storage medium such as a hard disk, cloud storage, random access memory (RAM), other types of computer readable memory, and the like. The storage may be used for saving scanned raw image data as original images, or for saving post-processed images. The controller may communicate with a cloud storage. A non-transitory computer readable medium may be provided that stores instructions for a processor of controller 19 to carry out beam forming, lens control, or other functions and methods consistent with the present disclosure. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

The block diagrams in the figures illustrate the architecture, functionality, and operation of possible implementations of systems, methods, and computer hardware or software products according to various exemplary embodiments of the present disclosure. In this regard, each block in a schematic diagram may represent certain arithmetical or logical operation processing that may be implemented using hardware such as an electronic circuit. Blocks may also represent a module, segment, or portion of code that comprises one or more executable instructions for implementing the specified logical functions. It should be understood that in some alternative implementations, functions indicated in a block may occur out of the order noted in the figures. For example, two blocks shown in succession may be executed or implemented substantially concurrently, or two blocks may sometimes be executed in reverse order, depending upon the functionality involved. Some blocks may also be omitted. For example, when apparatus 100 is a single-beam apparatus, it may be unnecessary to generate a plurality of beamlets, as in step 610 in some embodiments. Furthermore, when only one imaging condition is used, it may be unnecessary to change a focusing power of a compound lens, and thus step 570 may be omitted. Furthermore, steps such as compensating for astigmatism, or others, may be added at various portions. It should also be understood that each block of the block diagrams, and combination of the blocks, may be implemented by special purpose hardware-based systems that perform the specified functions or acts, or by combinations of special purpose hardware and computer instructions.

Although the present invention has been explained in relation to some exemplary embodiments, it is to be understood that other modifications and variation may be made without departing the spirit and scope of the invention as hereafter claimed. For example, although an electromagnetic compound lens has been discussed with reference to application as a first lens in a secondary imaging system, an electromagnetic compound lens may be applied as other lenses in a charged particle optical system. A compound lens may be used to focus a primary electron beam, secondary beam, or other beams. Furthermore, one or more lenses or other electron optical elements may be added at various locations to the particular constructions of exemplary charged particle optical systems discussed herein. Electron optical elements may be provided for, e.g., magnifying, zooming, and image anti-rotating etc.

The invention claimed is:

1. An electromagnetic compound lens comprising:
an electrostatic lens provided on an optical axis of the compound lens, and comprising a first electrode and a second electrode;
a magnetic lens provided on the optical axis, wherein the magnetic lens includes a permanent magnet surrounding the optical axis, the permanent magnet having an annular shape; and
a first magnetic pole piece and a second magnetic pole piece, the first magnetic pole piece and the second magnetic pole piece being magnetically coupled to opposite magnetic poles of the permanent magnet, wherein
the first magnetic pole piece, the second magnetic pole piece and the permanent magnet are between the first electrode and the second electrode along the optical axis.

2. The compound lens of claim 1, wherein:
the permanent magnet is between the first magnetic pole piece and the second magnetic pole piece along the optical axis; and
a gap is formed between the first magnetic pole piece and the second magnetic pole piece so that a magnetic field originally generated by the permanent magnet is directed to leak through the gap toward the optical axis, the gap having an annular shape.

3. The compound lens of claim 2, wherein the gap is formed on a radially inner side of the permanent magnet.

4. The compound lens of claim 2, wherein the gap is formed close to one end of the permanent magnet along the optical axis.

5. The compound lens of claim 1, wherein the first magnetic pole piece and the second magnetic pole piece directly contact the permanent magnet.

6. The compound lens of claim 1, wherein an inner diameter of the first magnetic pole piece is different from an inner diameter of the second magnetic pole piece.

7. The compound lens of claim 1, wherein the first magnetic pole piece is a third electrode of the electrostatic lens and the second magnetic pole piece is a fourth electrode of the electrostatic lens.

8. The compound lens of claim 2, wherein the electrostatic lens further comprises a third electrode between the first electrode and the second electrode along the optical axis.

9. The compound lens of claim 8, wherein the third electrode is provided in the gap.

10. The compound lens of claim 9, wherein the third electrode is provided completely within the gap.

11. The compound lens of claim 8, wherein the third electrode has an inner diameter smaller than an inner diameter of the first magnetic pole piece and an inner diameter of the second magnetic pole piece.

12. The compound lens of claim 8, wherein the third electrode covers inner surfaces of the first magnetic pole piece and the second magnetic pole piece facing the optical axis.

13. A charged particle optical system comprising:
a beam separator provided on a first optical axis, the beam separator configured to separate a plurality of beamlets of a primary charged particle beam generated by a source from a plurality of secondary charged particle beams emitted from a sample in response to illuminations of the plurality of beamlets, wherein the plurality of secondary charged particle beams travel along a second optical axis after passing through the beam separator;
a secondary imaging system configured to focus the plurality of secondary charged particle beams onto a detector along the second optical axis, wherein
the secondary imaging system includes an electromagnetic compound lens comprising:
an electrostatic lens provided on the second optical axis; and
a magnetic lens provided on the second optical axis, wherein the magnetic lens includes an annular permanent magnet.

14. A method to configure an electromagnetic compound lens with an optical axis, comprising:
forming a magnetic lens with a permanent magnet;
using two magnetic pole pieces to direct a magnetic field of the magnetic lens toward the optical axis, the two magnetic pole pieces being magnetically coupled to opposite magnetic poles of the permanent magnet; and
forming an electrostatic lens with two end electrodes surrounding the two magnetic pole pieces along the optical axis,
wherein a first dimension of a first end electrode of the two end electrodes in a direction perpendicular to the optical axis is greater than a second dimension of the first end electrode of the two end electrodes in a direction parallel to the optical axis.

15. The compound lens of claim 1, wherein the electromagnetic compound lens is configured to operate in a positive mode wherein one or both of the first electrode and the second electrode are set to a first potential and one or both of the first magnetic pole piece and the second magnetic pole piece are set to a second potential higher than the first potential.

16. The compound lens of claim 15, wherein the first electrode and the second electrode are set to the first potential.

17. The charged particle optical system of claim 13, wherein the electromagnetic compound lens includes:
a first magnetic pole piece and a second magnetic pole piece, the annular permanent magnet being between the first magnetic pole piece and the second magnetic pole piece along the second optical axis, the first magnetic pole piece and the second magnetic pole piece being magnetically coupled to opposite magnetic poles of the permanent magnet; and
a first electrode and a second electrode, wherein the annular permanent magnet, the first magnetic pole piece and the second magnetic pole piece are between the first electrode and the second electrode along the second optical axis.

18. The method of claim 14, further comprising:
operating the electrostatic lens in a positive mode wherein one or both of the end electrodes are set to a first potential and one or both of the magnetic pole pieces are set to a second potential higher than the first potential.

19. The method of claim 18, wherein the first potential is higher than ground potential.

* * * * *